US011166372B2

(12) United States Patent
Yamamoto

(10) Patent No.: US 11,166,372 B2
(45) Date of Patent: Nov. 2, 2021

(54) ELECTRONIC DEVICE

(71) Applicant: Murata Manufacturing Co., Ltd., Nagaokakyo (JP)

(72) Inventor: Junya Yamamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 125 days.

(21) Appl. No.: 16/599,168

(22) Filed: Oct. 11, 2019

(65) Prior Publication Data

US 2020/0045819 A1    Feb. 6, 2020

Related U.S. Application Data

(63) Continuation of application No. PCT/JP2018/017531, filed on May 2, 2018.

(30) Foreign Application Priority Data

May 16, 2017    (JP) .............................. JP2017-097116

(51) Int. Cl.
*H05K 1/00* (2006.01)
*H05K 1/18* (2006.01)
(Continued)

(52) U.S. Cl.
CPC ............. *H05K 1/142* (2013.01); *H01R 12/79* (2013.01); *H05K 1/18* (2013.01); *H05K 3/361* (2013.01);
(Continued)

(58) Field of Classification Search
CPC .......... H05K 1/142; H05K 1/18; H05K 3/361; H05K 7/2039; H01R 12/79
(Continued)

(56) References Cited

U.S. PATENT DOCUMENTS

| 5,920,465 A | 7/1999 | Tanaka |
| 6,817,870 B1 | 11/2004 | Kwong et al. |

(Continued)

FOREIGN PATENT DOCUMENTS

| JP | 07-30224 A | 1/1995 |
| JP | 09-130001 A | 5/1997 |

(Continued)

OTHER PUBLICATIONS

Official Communication issued in International Patent Application No. PCT/JP2018/017531, dated Jul. 3, 2018.

*Primary Examiner* — Andargie M Aychillhum
(74) *Attorney, Agent, or Firm* — Keating & Bennett, LLP

(57) ABSTRACT

An electronic device includes an interposer substrate including a substrate body that includes a first principal surface and a second principal surface, a first surface terminal electrode that is provided on the first principal surface and includes a terminal electrode for heat dissipation and a terminal electrode for external connection, a second surface terminal electrode that is provided on the second principal surface, a conductor for signal transmission that is provided on the substrate body and connects the terminal electrode for external connection and the second surface terminal electrode, and a conductor for heat conduction that is provided on the substrate body and connects the terminal electrode for external connection or the second surface terminal electrode to the terminal electrode for heat dissipation.

19 Claims, 25 Drawing Sheets

(51) Int. Cl.
*H05K 7/00* (2006.01)
*H05K 1/14* (2006.01)
*H01R 12/79* (2011.01)
*H05K 3/36* (2006.01)
*H05K 7/20* (2006.01)

(52) U.S. Cl.
CPC . *H05K 7/2039* (2013.01); *H05K 2201/10318* (2013.01); *H05K 2201/10621* (2013.01)

(58) Field of Classification Search
USPC .......................................................... 361/748
See application file for complete search history.

(56) References Cited

U.S. PATENT DOCUMENTS

| | | |
|---|---|---|
| 9,324,678 B2 | 4/2016 | Ganesan et al. |
| 2010/0091501 A1 | 4/2010 | Tan et al. |
| 2014/0012123 A1* | 1/2014 | Guger .................... A61B 5/291 |
| | | 600/393 |
| 2015/0091676 A1 | 4/2015 | Kato et al. |

FOREIGN PATENT DOCUMENTS

| | | | |
|---|---|---|---|
| JP | 10-209594 A | | 8/1998 |
| JP | 2005-044779 A | | 2/2005 |
| JP | 2013-247168 A | | 12/2013 |
| JP | 2017-022282 A | | 1/2017 |
| JP | 2017022282 | * | 1/2017 |
| WO | 2014/002592 A1 | | 1/2014 |

* cited by examiner

ELECTRONIC DEVICE

CROSS REFERENCE TO RELATED APPLICATIONS

This application claims the benefit of priority to Japanese Patent Application No. 2017-097116 filed on May 16, 2017 and is a Continuation Application of PCT Application No. PCT/JP2018/017531 filed on May 2, 2018. The entire contents of each application are hereby incorporated herein by reference.

BACKGROUND OF THE INVENTION

1. Field of the Invention

The present invention relates to an interposer substrate and an electronic device that includes the interposer substrate.

2. Description of the Related Art

Conventionally, in an electronic component for which miniaturization and high density integration are demanded, various mounting structures in which, when modular components that include a predetermined function are connected to each other, the modular components are mounted on a plurality of small circuit boards, respectively, without using one large sheet of circuit board, and then the plurality of small circuit boards are connected through a connection element that has a flexible structure, have been practically used.

For example, in the structures disclosed in Japanese Unexamined Patent Application Publication No. H07-030224 and U.S. Pat. No. 9,324,678, a plurality of circuit packages are connected through a flexible cable.

However, since the electronic device using the structures disclosed in Japanese Unexamined Patent Application Publication No. H07-030224 and U.S. Pat. No. 9,324,678 do not include a large circuit board, the electronic device is not able to include a ground pattern having a large area, and is not able to efficiently dissipate heat generated from an IC chip and similar components.

SUMMARY OF THE INVENTION

Preferred embodiments of the present invention provide electronic devices that each including a path to dissipate heat from an electronic component such as an IC chip, and interposer substrates to be used for the electronic devices.

An interposer substrate according to a preferred embodiment of the present invention includes a substrate body that includes a first principal surface and a second principal surface, a first surface terminal electrode that is provided on the first principal surface and includes a terminal electrode for heat dissipation and a terminal electrode for external connection, a second surface terminal electrode that is provided on the second principal surface, a conductor for signal transmission that is provided on the substrate body and connects the terminal electrode for external connection and the second surface terminal electrode, and a conductor for heat conduction that is provided on the substrate body and connects the terminal electrode for external connection or the second surface terminal electrode to the terminal electrode for heat dissipation.

In this configuration, heat generated from the electronic component provided on the side of the second principal surface is conducted from the second surface terminal electrode to the terminal electrode for heat dissipation of the first surface terminal electrode provided on the first principal surface through the conductor for heat conduction.

In addition, in an interposer substrate according to a preferred embodiment of the present invention, at least one convex-shaped portion may preferably be provided on the first principal surface, and the terminal electrode for heat dissipation may preferably be provided on a top surface of the convex-shaped portion.

In this configuration, the terminal electrode for heat dissipation is provided at the convex-shaped portion of the first principal surface, so that the terminal electrode for heat dissipation provided on the first principal surface and the terminal electrode for external connection are not flush with each other. Therefore, an element for heat dissipation to be connected to the terminal electrode for heat dissipation and the flexible element to be connected to the terminal electrode for external connection are not provided on the same layer, which enables easy mounting.

In addition, in an interposer substrate according to a preferred embodiment of the present invention, the conductor for heat conduction that connects the terminal electrode for heat dissipation and the second surface terminal electrode may preferably include a via conductor that extends in a direction perpendicular or substantially perpendicular to the first principal surface and the second principal surface of the substrate body.

In this configuration, the via conductor is provided in the direction perpendicular or substantially perpendicular to the first principal surface and the second principal surface, so that thermal resistance between the second surface terminal electrode and the terminal electrode for heat dissipation is reduced.

In addition, in an interposer substrate according to a preferred embodiment of the present invention, when viewed from a direction perpendicular or substantially perpendicular to the first principal surface and the second principal surface, the conductor for heat conduction may preferably have a cross-sectional area larger than the conductor for signal transmission.

With this configuration, the cross-sectional area of the conductor for heat conduction is increased, so that heat is more easily conducted.

In addition, an electronic device according to a preferred embodiment of the present invention includes the interposer substrate, a flexible element that has a flat film shape and includes a terminal electrode, and an element for heat dissipation that has a flat plate shape. The terminal electrode for external connection of the interposer substrate is bonded to the terminal electrode. The terminal electrode for heat dissipation of the interposer substrate is thermally connected to the element for heat dissipation.

With this configuration, the terminal electrode for heat dissipation is thermally connected to the element for heat dissipation, so that heat is able to be efficiently conducted to the element for heat dissipation. In addition, the flexible element that has a flat film shape and the element for heat dissipation that has a flat plate shape are provided, so that the thickness of the electronic device is not increased.

In addition, an electronic device according to a preferred embodiment of the present invention may preferably include a printed wiring board on which a heat generating component is mounted. In addition, the second surface terminal electrode of the interposer substrate may preferably be connected to the printed wiring board through a conductive bonding material.

In this configuration, a heat generating element of the printed wiring board is conducted from the second surface terminal electrode to the terminal electrode for heat dissipation through the conductor for heat conduction.

In addition, in an electronic device according to a preferred embodiment of the present invention, the flexible element may preferably include an attachment portion that includes the terminal electrode. In addition, the attachment portion may preferably include an opening, when viewed from a direction perpendicular or substantially perpendicular to the first principal surface and the second principal surface of the interposer substrate, the opening may preferably have the same or substantially the same shape as the convex-shaped portion or may preferably have a shape that surrounds at least a portion of the convex-shaped portion, and the convex-shaped portion may preferably be disposed inside the opening.

In this configuration, the convex-shaped portion is fitted into the opening, so that the flexible element is fixed and does not easily detach.

In addition, in an electronic device according to a preferred embodiment of the present invention, the flexible element may preferably include an attachment portion that includes the terminal electrode. In addition, the attachment portion may preferably include at least one projecting portion that projects in an extending direction of the flexible element and in a direction perpendicular or substantially perpendicular to a thickness direction of the flexible element. In addition, the interposer substrate may preferably include at least two convex-shaped portions, and the projecting portion may preferably be disposed between the at least two convex-shaped portions.

In this configuration, the projecting portion is fitted between the plurality of convex-shaped portions of the interposer substrate, so that the flexible element is fixed and does not easily detach.

According to preferred embodiments of the present invention, heat generated from an electronic component is able to be effectively dissipated.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the accompanying drawings.

First Preferred Embodiment

Figure 1A:
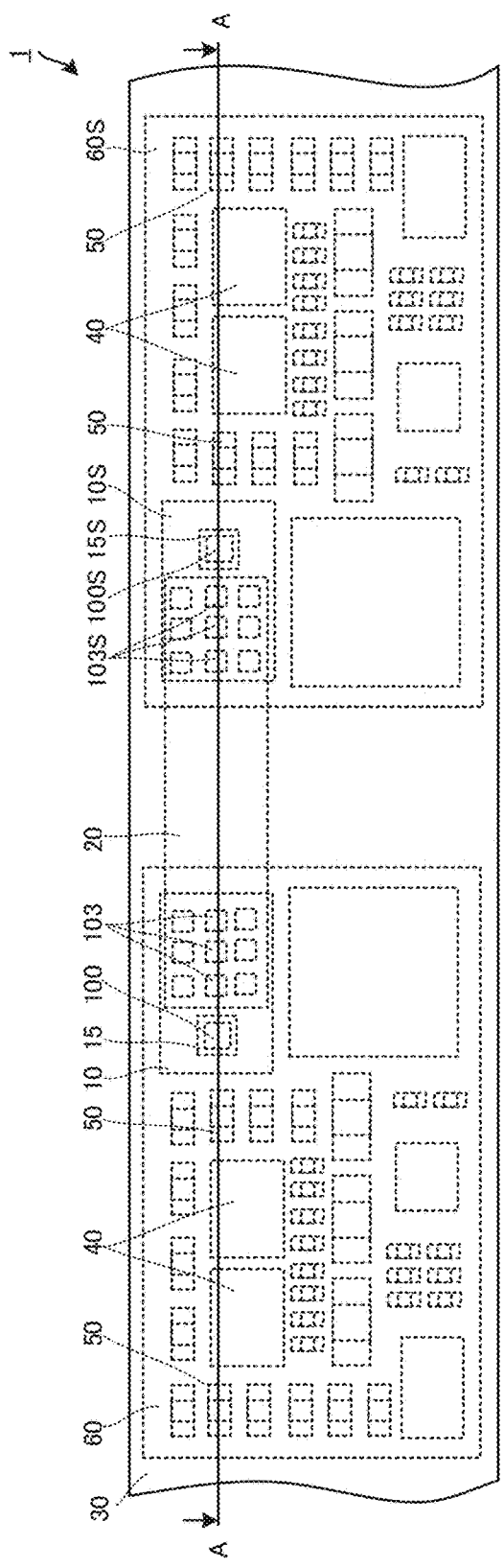
FIG. 1A is an external view from a side of a first principal surface of an electronic device 1 according to a first preferred embodiment of the present invention.
Figure 1B:
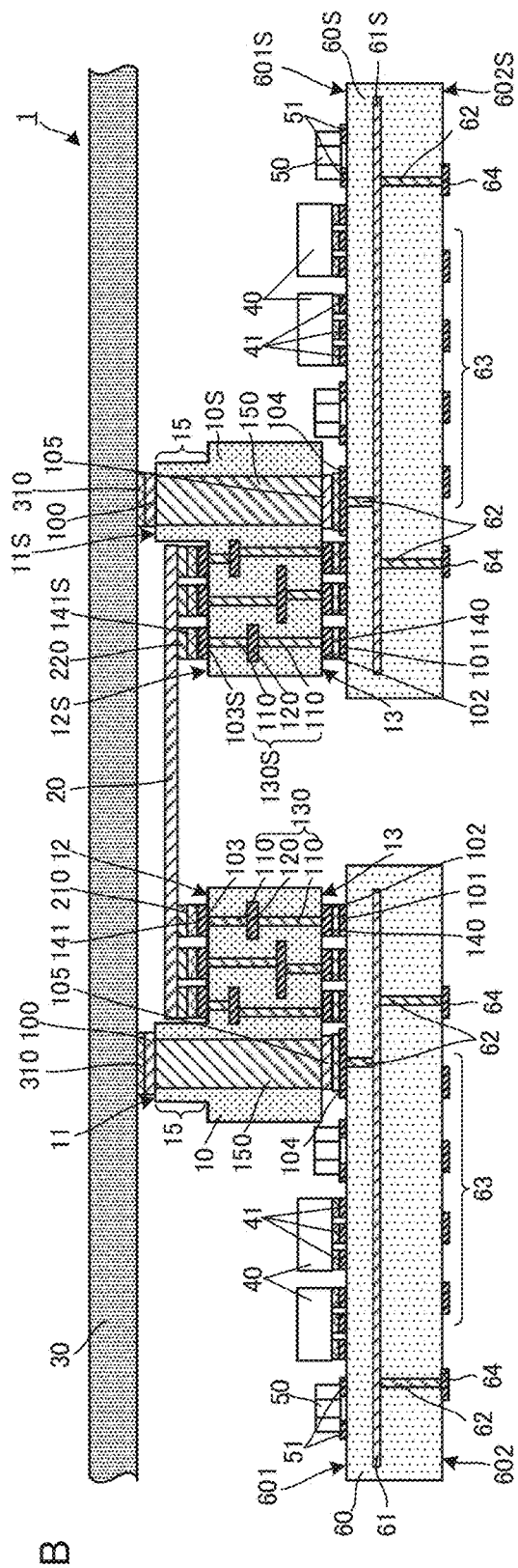
FIG. 1B is a cross-sectional view taken along a line A-A in FIG. 1A.
Figure 2:
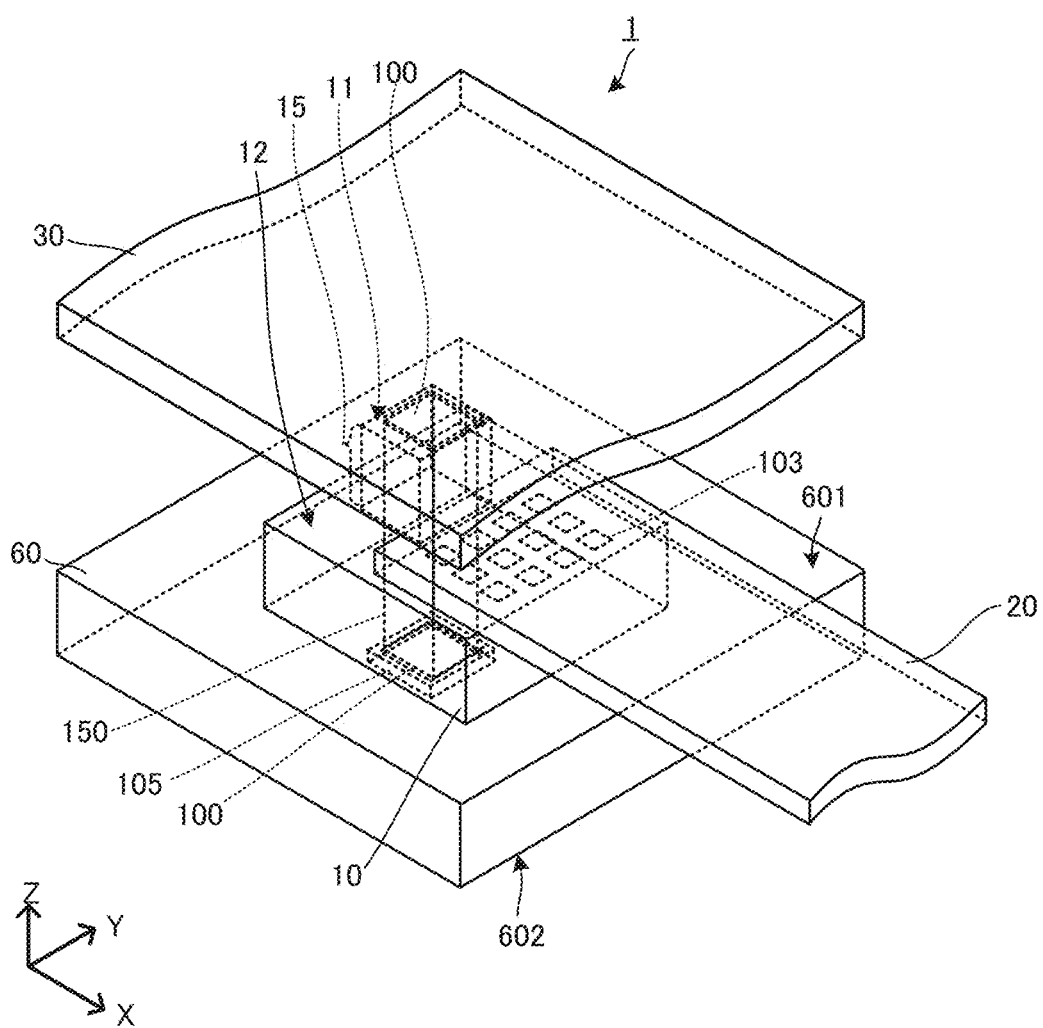
FIG. 2 is a perspective view showing a configuration of a portion of the electronic device 1 according to the first preferred embodiment of the present invention.
Figure 3:
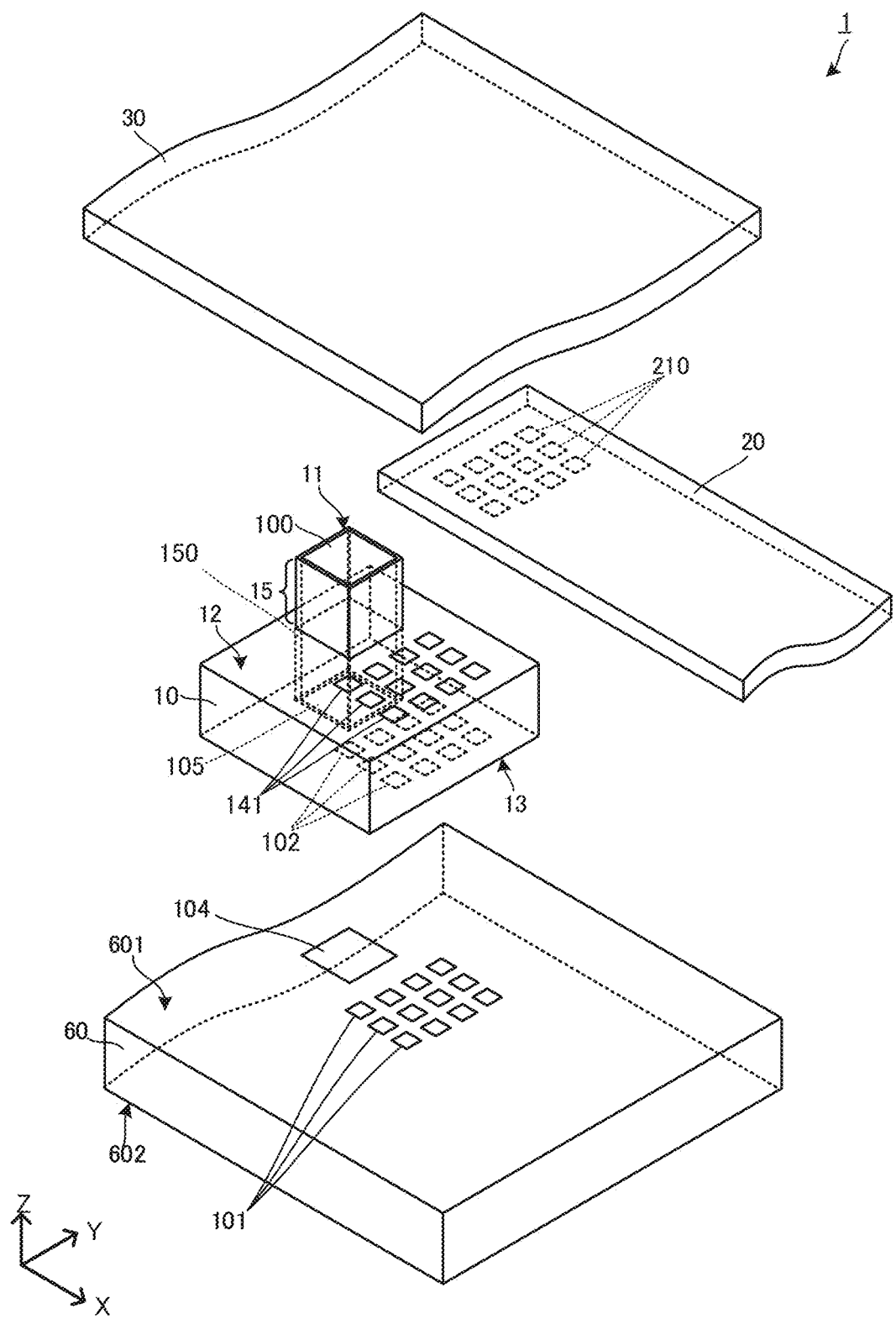
FIG. 3 is an exploded perspective view showing a configuration of the portion of the electronic device 1 according to the first preferred embodiment of the present invention.
Figure 4:
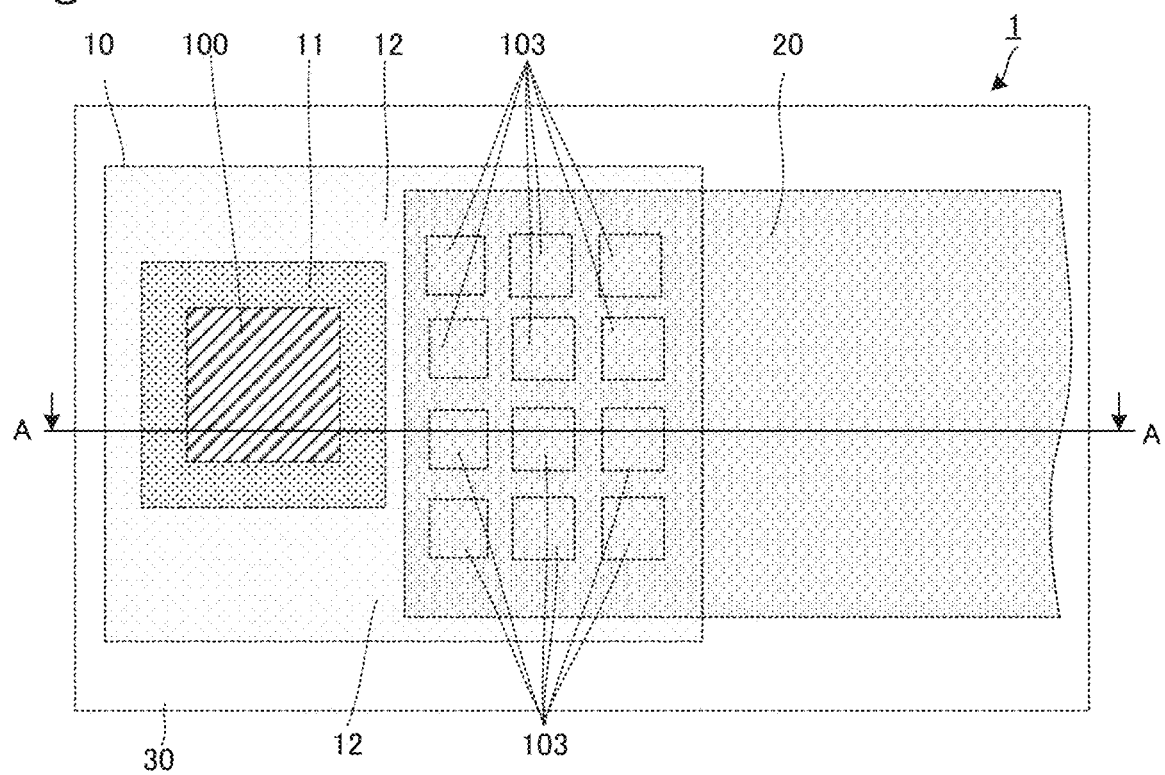
FIG. 4 is a view showing a configuration of a portion of the electronic device 1 viewed from the side of the first principal surface of the electronic device 1 according to the first preferred embodiment of the present invention.
Figure 5:
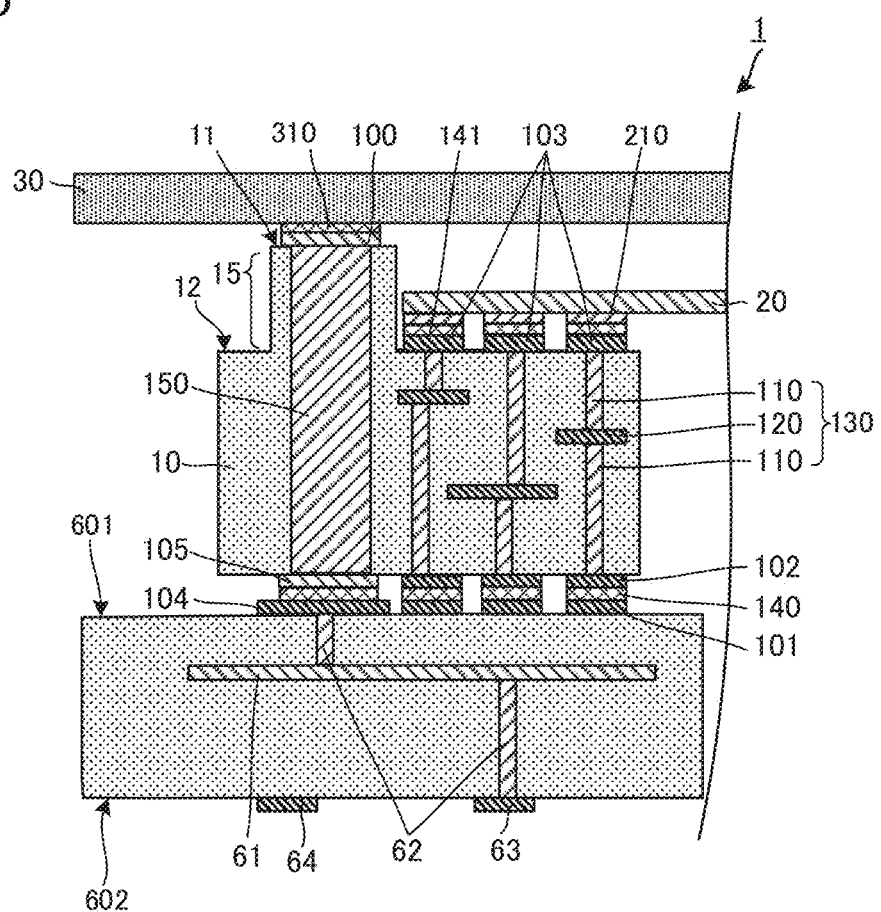
FIG. 5 is a side cross-sectional view showing a configuration of a portion of the electronic device 1 according to the first preferred embodiment of the present invention.

An electronic device according to a first preferred embodiment of the present invention will be described with reference to the drawings. FIG. 1A is an external view from a side of a first principal surface of an electronic device 1 according to the first preferred embodiment of the present invention. FIG. 1B is a cross-sectional view taken along a line A-A line in FIG. 1A. FIG. 2 is a perspective view showing a configuration of a portion of the electronic device 1 according to the first preferred embodiment of the present invention. FIG. 3 is an exploded perspective view showing a configuration of the portion of the electronic device 1 according to the first preferred embodiment of the present invention. FIG. 4 is a view showing a configuration of a portion of the electronic device 1 according to the first preferred embodiment of the present invention as viewed from the side of the first principal surface. FIG. 5 is a side cross-sectional view showing a configuration of a portion of the electronic device 1 according to the first preferred embodiment of the present invention. It is to be noted that, in each drawing, in order to make a configuration easy to see, some reference numerals are omitted and dimensional relationship is appropriately changed.

As shown in FIG. 1A, FIG. 1B, FIG. 2, FIG. 3, FIG. 4, and FIG. 5, the electronic device 1 includes interposer substrates 10 and 10S, a flexible element 20, an element 30 for heat dissipation, surface-mounted electronic components 40 and 50, and printed wiring boards 60 and 60S. Since the interposer substrate 10 and the interposer substrate 10S, and the printed wiring board 60 and the printed wiring board 60S have the same or substantially the same configurations, the interposer substrate 10 and the printed wiring board 60 are used for description. In FIG. 2 and FIG. 3, the thickness direction of the interposer substrate 10 is parallel or substantially parallel in the Z direction, and two directions perpendicular or substantially perpendicular to the Z direction are the X direction and the Y direction.

The printed wiring board 60 and the printed wiring board 60S are spaced apart from each other. The printed wiring board 60, for example, preferably has a rectangular or substantially rectangular shape, that is, a rectangular or substantially rectangular parallelepiped shape, in a plan view. In other words, the printed wiring board 60 includes a first principal surface 601 and a second principal surface 602 that face each other, and further includes a side surface that continuously connects the first principal surface 601 and the second principal surface 602. The printed wiring board 60 is preferably, for example, a glass epoxy substrate such as FR4.

A terminal electrode 63 for external connection is provided on the second principal surface 602 of the printed wiring board 60. A plurality of land electrodes 41, 51, and 101 for component mounting and a land electrode 104 for heat dissipation are provided on the first principal surface 601 of the printed wiring board 60. The land electrodes 41 and 51 for component mounting are connected to a terminal electrode 64 for grounding and the terminal electrode 63 for external connection, through connection conductors 61 and 62 in a predetermined circuit pattern. The land electrode 104 for heat dissipation is connected to the terminal electrode 64 for grounding.

The surface-mounted electronic component 40 is mounted on the land electrode 41 for component mounting, and the surface-mounted electronic component 50 is mounted on the land electrode 51 for component mounting. The surface-mounted electronic component 40 is a heat generating element, such as a transistor or FET, for example.

The interposer substrate 10 includes a convex-shaped portion 15. The interposer substrate 10 includes first principal surfaces 11 and 12 and a second principal surface 13. In addition, a top surface of the convex-shaped portion 15 coincides with the first principal surface 11.

The interposer substrate 10 is preferably an LTCC multilayer substrate mainly made of glass ceramics, for example, and is obtained by stacking and firing a ceramic green sheet and an electrode material. The electrode material of a surface layer or an inner layer preferably includes Ag or Cu, for example, as a main component. Such a metal material has excellent thermal conductivity. In addition, the interposer substrate 10 may be an HTCC multilayer substrate such as alumina, a single-layer substrate, and a resin substrate such as epoxy, for example.

The first principal surface 11 includes a terminal electrode 100 for heat dissipation. The first principal surface 12 includes a plurality of terminal electrodes 103 for external connection. The terminal electrode 100 for heat dissipation corresponds to the "terminal electrode for heat dissipation", and the plurality of terminal electrode 103 for external connection correspond to the "terminal electrode for external connection". The terminal electrode 100 for heat dissipation and the plurality of terminal electrodes 103 for external connection are collectively referred to as the "first surface terminal electrode". The plurality of terminal electrodes 103 for external connection are provided on the first principal surface 12 in a predetermined arrangement pattern.

The second principal surface 13 includes a terminal electrode 105 for heat dissipation and a plurality of terminal electrodes 102. The terminal electrode 105 for heat dissipation and the plurality of terminal electrodes 102 correspond to the "second surface terminal electrode". The terminal electrode 105 for heat dissipation faces the terminal electrode 100 for heat dissipation. The plurality of terminal electrodes 102 are provided on the second principal surface 13 in a predetermined arrangement pattern.

A conductor 150 for heat conduction and a plurality of wiring conductors 130 are provided inside the interposer substrate 10. The conductor 150 for heat conduction is a via conductor that extends in a direction perpendicular or substantially perpendicular to the first principal surface 11 and the second principal surface 13. The conductor 150 for heat conduction connects the terminal electrode 100 for heat dissipation and the terminal electrode 105 for heat dissipation. The conductor 150 for heat conduction corresponds to the "conductor for heat conduction".

The plurality of terminal electrodes 102 of the interposer substrate 10 are mechanically and electrically connected to the plurality of land electrodes 101 for component mounting provided on the first principal surface 601 of the printed wiring board 60 through solder 140. It is to be noted that connection between the plurality of terminal electrodes 102 and the plurality of land electrodes 101 for component mounting is not limited to solder and may be any material as long as the material has conductivity, such as conductive paste, for example.

The flexible element 20 is a flexible substrate or a flexible cable. The flexible element 20 is preferably made of thermoplastic resin such as polyimide or liquid crystal polymer, as a base material, for example, and includes a transmission line, a power source line, and a ground line.

The flexible element 20 includes a plurality of external terminal electrodes 210 and 220 that are connected to each line. The plurality of terminal electrodes 103 for external connection of the interposer substrate 10 are connected to the plurality of external terminal electrodes 210 through solder 141, respectively. A plurality of terminal electrodes 103S for external connection of the interposer substrate 10S are connected to the plurality of external terminal electrodes 220 through solder 141S, respectively. In other words, the printed wiring board 60 and the printed wiring board 60S are electrically connected through the flexible element 20. It is to be noted that connection between the plurality of external terminal electrodes 210 and 220 and the plurality of terminal electrodes 103 for external connection is not limited to solder and may be any material as long as the material has conductivity, such as conductive paste, for example.

It is to be noted that a region of the flexible element 20 in which the plurality of external terminal electrodes 210 and 220 are provided and connected to the plurality of terminal electrodes 103 for external connection of the interposer substrate 10 is "an attachment portion".

The wiring conductor 130 includes a via conductor 110 and a flat conductor pattern 120. The flat conductor pattern 120 includes a plane perpendicular or substantially perpendicular to the via conductor 110. The wiring conductor 130 respectively connects the plurality of terminal electrodes 102 and the plurality of terminal electrodes 103 for external connection. The wiring conductor 130 corresponds to the "conductor for signal transmission".

The element 30 for heat dissipation may be a heat dissipation plate or a heat dissipation sheet, for example, and includes a large metal plate, a heat pipe, a heat sink, a heat spreader, a graphite sheet, and a metal housing. The element 30 for heat dissipation may be rigid or may include a flexible base material. The element 30 for heat dissipation is disposed on the first principal surface of the terminal electrode 100 for heat dissipation.

The terminal electrode 100 for heat dissipation provided on the first principal surface 11 of the interposer substrate 10 is connected to the element 30 for heat dissipation through a conductive element 310. The terminal electrode 105 for heat dissipation provided on the second principal surface 13 of the interposer substrate 10 is connected to the land electrode 104 for heat dissipation through the solder 140. It is to be noted that connection between the terminal electrode 105 for heat dissipation and the land electrode 104 for heat dissipation is not limited to solder and may be any material as long as the material has conductivity, such as conductive paste, for example. Further, the land electrode 104 for heat dissipation is provided on the first principal surface 601 of the printed wiring board 60. The conductive element 310 may be heat dissipation grease, for example, and may be an element with high thermal conductivity.

In this manner, the printed wiring board 60 is connected to the element 30 for heat dissipation through the interposer substrate 10.

With such a configuration, the heat generated in the printed wiring board 60 is able to be efficiently conducted in order of the terminal electrode 105 for heat dissipation, the conductor 150 for heat conduction, and the terminal electrode 100 for heat dissipation, and is dissipated from the element 30 for heat dissipation.

It is to be noted that the diameter of the conductor 150 for heat conduction may preferably be larger than the diameter of the via conductor 110 for signal transmission. As a result, heat is able to be efficiently dissipated.

The conductor 150 for heat conduction may preferably include a via conductor that extends not in an in-plane direction parallel or substantially parallel to the first principal surface 11 and the second principal surface 13 but in a direction perpendicular or substantially perpendicular to the first principal surface 11 and the second principal surface 13. As a result, heat is able to be further efficiently dissipated.

The interposer substrate 10 is mounted on the first principal surface 601 of the printed wiring board 60. The conductor 150 for heat conduction penetrates the region in which the interposer substrate 10 and the convex-shaped portion 15 of the interposer substrate 10 are provided, in the thickness direction. The element 30 for heat dissipation is mounted on the terminal electrode 100 for heat dissipation on the side of the first principal surface 11 that includes the convex-shaped portion 15 of the interposer substrate 10.

The plurality of terminal electrodes 103 for external connection provided on the first principal surface 12 of the interposer substrate 10 are connected to the flexible element 20 through the solder 141.

In addition, the interposer substrate 10 includes the convex-shaped portion 15, so that positions of the element 30 for heat dissipation and the flexible element 20 are different from one another in the thickness direction, which facilitates mounting.

It is to be noted that the conductor 150 for heat conduction may be at least partially provided on the side surface of the interposer substrate 10, that is, the side surface that continuously connects the first principal surface 11 and the second principal surface 13, instead of inside the interposer substrate 10.

In addition, the flexible element 20 may include a heat dissipation layer. In other words, the flexible element 20 is thermally connected to the terminal electrode 100 for heat dissipation of the interposer substrate 10, so that a heat dissipation effect is able to be obtained.

Second Preferred Embodiment

Figure 6:
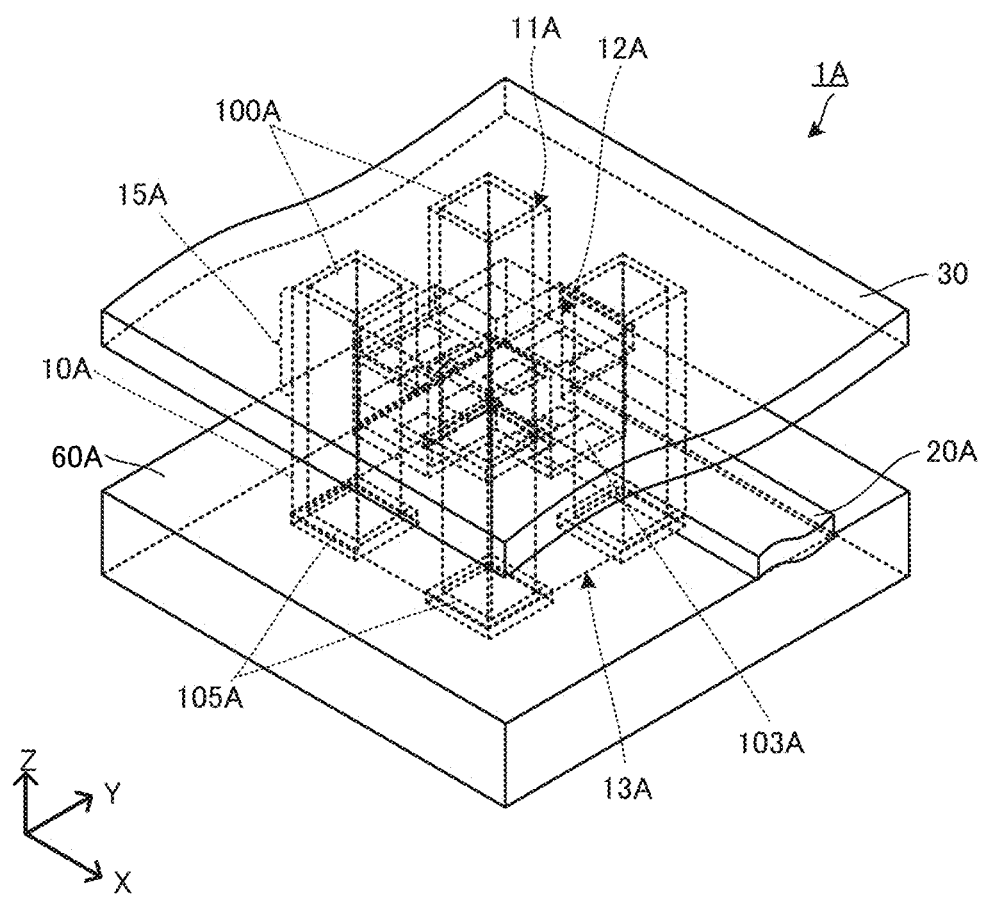
FIG. 6 is a perspective view showing a configuration of a portion of an electronic device 1A according to a second preferred embodiment of the present invention.
Figure 7:
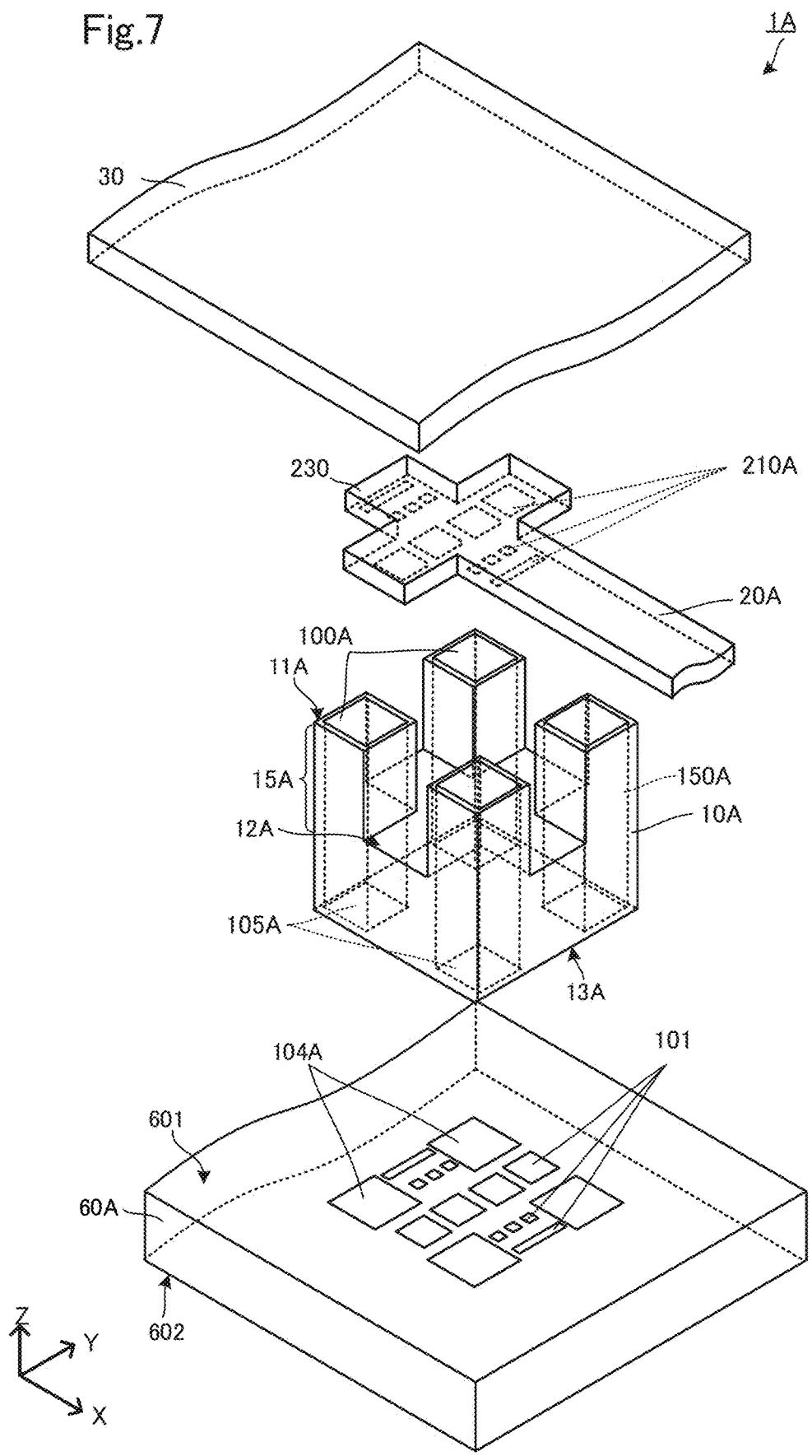
FIG. 7 is an exploded perspective view showing a configuration of the portion of the electronic device 1A according to the second preferred embodiment of the present invention.
Figure 8:
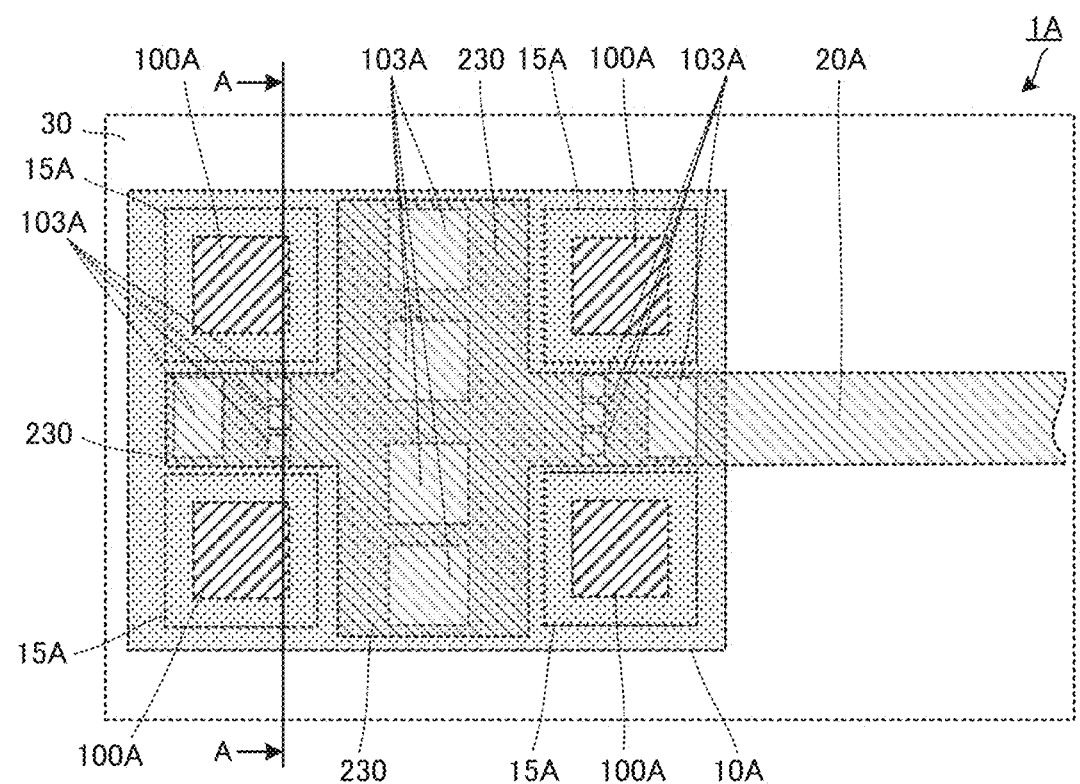
FIG. 8 is a view showing a configuration of a portion of the electronic device 1A viewed from a side of a first principal surface of the electronic device 1A according to the second preferred embodiment of the present invention.
Figure 9:
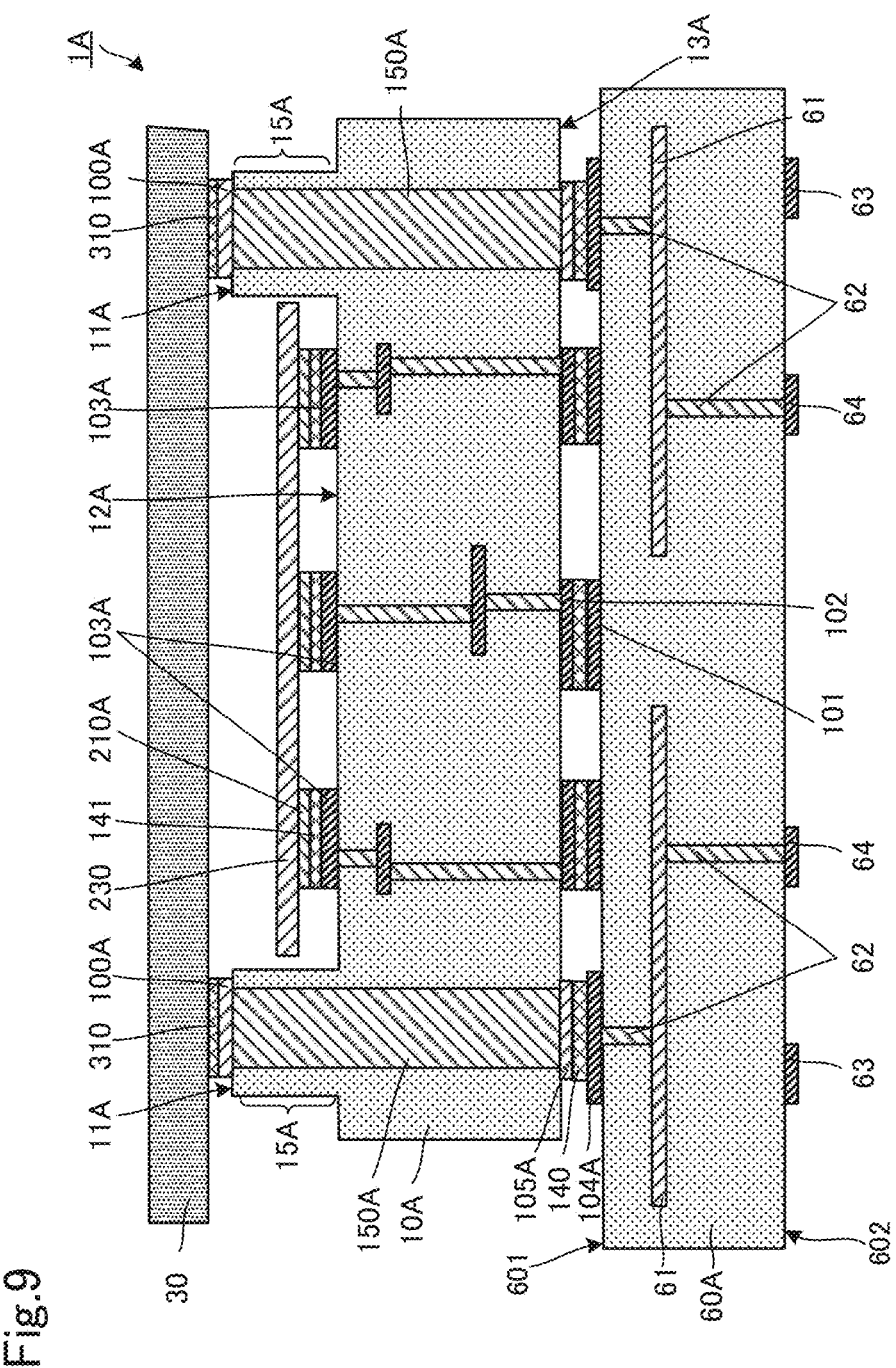
FIG. 9 is a side cross-sectional view showing a configuration of a portion of the electronic device 1A according to the second preferred embodiment of the present invention.

An electronic device according to a second preferred embodiment of the present invention will be described with reference to the drawings. FIG. 6 is a perspective view showing a configuration of a portion of an electronic device 1A according to the second preferred embodiment of the present invention. FIG. 7 is an exploded perspective view showing a configuration of the portion of the electronic device 1A according to the second preferred embodiment of the present invention. FIG. 8 is a view showing a configuration of a portion of the electronic device 1A viewed from a side of a first principal surface of the electronic device 1A according to the second preferred embodiment of the present invention. FIG. 9 is a cross-sectional view taken along a line A-A in FIG. 8, showing a configuration of a portion of the electronic device 1A according to the second preferred embodiment of the present invention.

As shown in FIG. 6, FIG. 7, FIG. 8, and FIG. 9, the electronic device 1A according to the second preferred embodiment and the electronic device 1 according to the first preferred embodiment are different in the shapes of an interposer substrate 10A, a flexible element 20A, and a land electrode 104A for heat dissipation provided on a printed wiring board 60A. Other configurations of the electronic device 1A are the same as or similar to the configurations of the electronic device 1, and a description of the same or similar configurations will be omitted. In FIG. 6, FIG. 7, FIG. 8, and FIG. 9, in order to make the drawings easy to see, the addition of some electronic components and some reference numerals is omitted.

As shown in FIG. 6, FIG. 7, FIG. 8, and FIG. 9, the interposer substrate 10A includes first principal surfaces 11A and 12A and a second principal surface 13A. In addition, a top surface of the convex-shaped portion 15A coincides with the first principal surface 11A.

The interposer substrate 10A includes a plurality of convex-shaped portions 15A. More specifically, four convex-shaped portions 15A are preferably provided at four corners of the first principal surface 12A of the interposer substrate 10A.

A terminal electrode 100A for heat dissipation is provided on the first principal surface 11A. A plurality of terminal electrodes 103A for external connection are provided on the first principal surface 12A. The terminal electrode 100A for heat dissipation corresponds to the "terminal electrode for heat dissipation", and the plurality of terminal electrode 103A for external connection correspond to the "terminal electrode for external connection". The plurality of terminal electrodes 103A for external connection are provided on the first principal surface 12A in a predetermined arrangement pattern.

A plurality of conductors 150A for heat conduction are provided inside the interposer substrate 10A. The plurality of conductors 150A for heat conduction are via conductors that extend in a direction perpendicular or substantially perpendicular to the first principal surface 11A and the second principal surface 13A. Each of the plurality of conductors 150A for heat conduction connects the terminal electrode 100A for heat dissipation and a terminal electrode 105A for heat dissipation that face each other.

A plurality of land electrodes 104A for heat dissipation are provided on a first principal surface 601 of a printed wiring board 60. A plurality of terminal electrodes 105A for heat dissipation provided on the second principal surface 13A of the interposer substrate 10A are connected to the plurality of land electrodes 104A for heat dissipation through solder 140. The plurality of terminal electrodes 100A for heat dissipation provided on the first principal surface 11A of the interposer substrate 10A are connected to an element 30 for heat dissipation through a conductive element 310. In other words, the printed wiring board 60 is connected to the element 30 for heat dissipation through the interposer substrate 10A.

The flexible element 20A includes a plurality of projecting portions 230 at an end in an extending direction. One projecting portion 230 is provided in a direction in which the flexible element 20A extends and two projecting portions 230 are provided in a direction perpendicular or substantially perpendicular to the extending direction of the flexible element 20A. With such a configuration including the plurality of projecting portions 230, an attachment portion according to the second preferred embodiment is obtained. The attachment portion of the flexible element 20A preferably has a cross shape, for example.

The flexible element 20A is connected to the interposer substrate 10A by the attachment portion.

Specifically, as shown in FIG. 9, each of the projecting portions 230 provided on the flexible element 20A is interposed between two convex-shaped portions 15A of the interposer substrate 10A. In such a state, the plurality of terminal electrodes 103A for external connection provided on the first principal surface 12A of the interposer substrate 10A and a plurality of external terminal electrode 210A provided on the flexible element 20A are connected through solder 141.

Even with such a configuration, the heat generated in the printed wiring board 60 is able to be efficiently conducted in order of the terminal electrode 105A for heat dissipation, the conductor 150A for heat conduction, and the terminal electrode 100A for heat dissipation. In addition, the number of conductors 150A for heat conduction is increased, and the cross-sectional area of a conduction path of the heat of the entire interposer substrate 10A is increased, so that heat is able to be further efficiently conducted. It is to be noted that, as the diameter of the conductor 150A for heat conduction is larger than the diameter of the via conductor 110, heat is able to be more efficiently dissipated.

Further, with a configuration in which the flexible element 20A includes the projecting portion 230, even when the flexible element 20A moves in a direction parallel or substantially parallel to the first principal surface 11A, the projecting portion 230 is configured to be retained by the convex-shaped portion 15A of the interposer substrate 10A. In other words, due to a shift at a time of attachment or a tensile stress, the flexible element 20A is hardly separated from the interposer substrate 10A. From the above description, the attachment portion of the flexible element 20A may preferably have a shape in which the projecting portion 230 is provided so as to avoid the convex-shaped portion 15A of the interposer substrate 10A.

Third Preferred Embodiment

Figure 10:
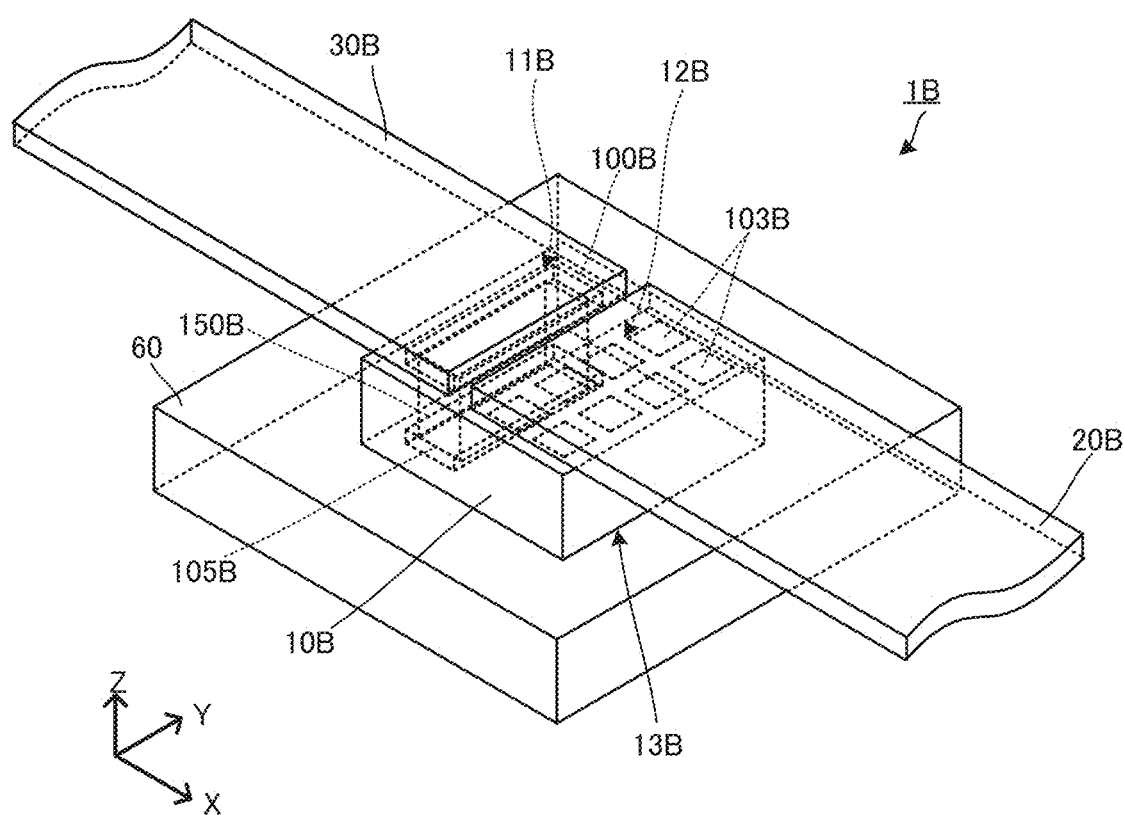
FIG. 10 is a perspective view showing a configuration of a portion of an electronic device 1B according to a third preferred embodiment of the present invention.
Figure 11:
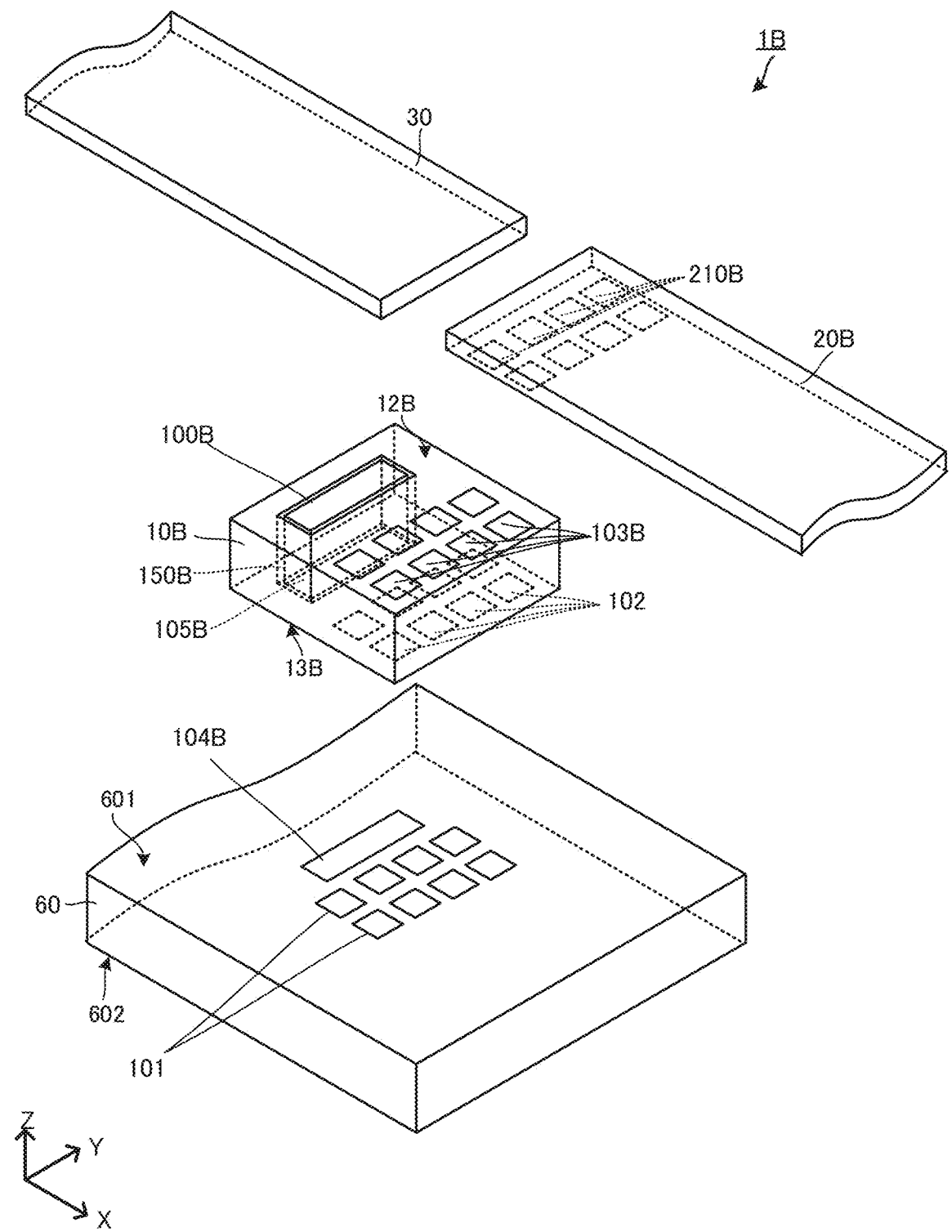
FIG. 11 is an exploded perspective view showing a configuration of the portion of the electronic device 1B according to the third preferred embodiment of the present invention.
Figure 12:
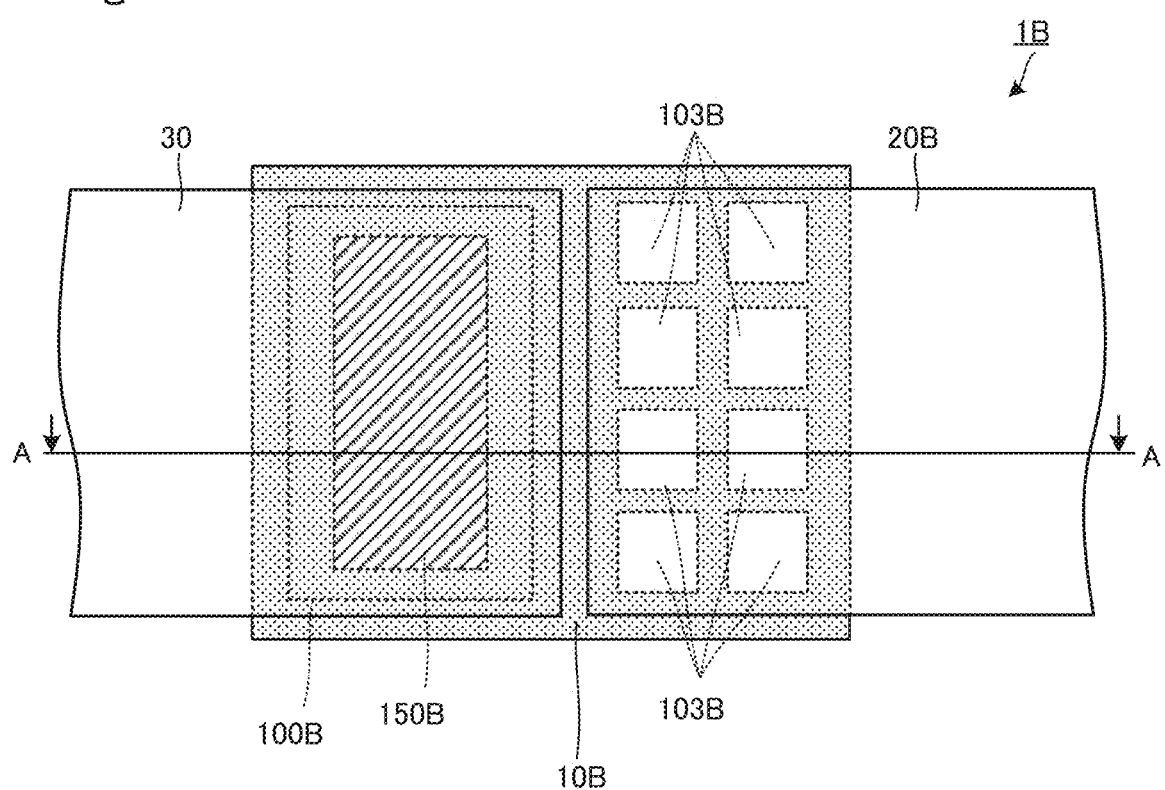
FIG. 12 is a view showing a configuration of a portion of the electronic device 1B viewed from a side of a first principal surface of the electronic device 1B according to the third preferred embodiment of the present invention.
Figure 13:
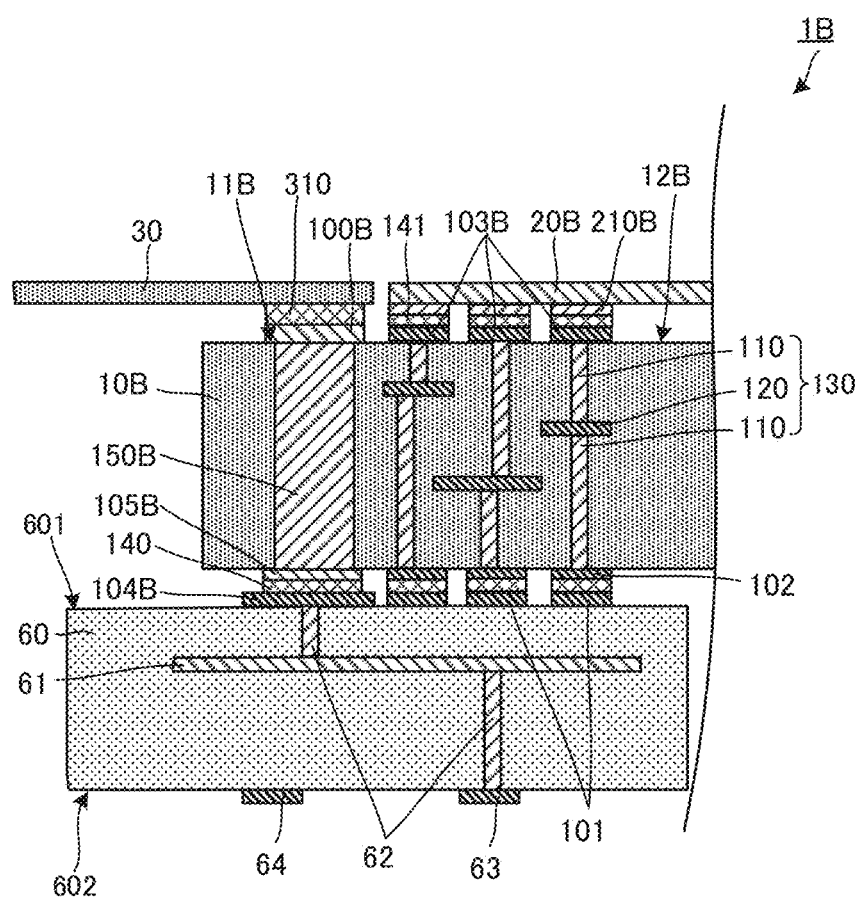
FIG. 13 is a side cross-sectional view showing a configuration of a portion of the electronic device 1B according to the third preferred embodiment of the present invention.

An electronic device according to a third preferred embodiment of the present invention will be described with reference to the drawings. FIG. 10 is a perspective view showing a configuration of a portion of an electronic device 1B according to the third preferred embodiment of the present invention. FIG. 11 is an exploded perspective view showing a configuration of the portion of the electronic device 1B according to the third preferred embodiment of the present invention. FIG. 12 is a view showing a configuration of a portion of the electronic device 1B viewed from a side of a first principal surface of the electronic device 1B according to the third preferred embodiment of the present invention. FIG. 13 is a cross-sectional view taken along a line A-A in FIG. 12, showing a configuration of a portion of the electronic device 1B according to the third preferred embodiment of the present invention.

As shown in FIG. 10, FIG. 11, FIG. 12, and FIG. 13, the electronic device 1B according to the third preferred embodiment and the electronic device 1 according to the first preferred embodiment are different in the shapes of an interposer substrate 10B, and a land electrode 104B for heat dissipation provided on a printed wiring board 60. Other configurations of the electronic device 1B are the same as or similar to the configurations of the electronic device 1, and a description of the same or similar configurations will be omitted. In FIG. 10, FIG. 11, FIG. 12, and FIG. 13, in order to make the drawings easy to see, the addition of some electronic components and some reference numerals is omitted.

As shown in FIG. 10, FIG. 11, and FIG. 12, the interposer substrate 10B includes first principal surfaces 11B and 12B and a second principal surface 13B. The first principal surface 11B and the first principal surface 12B are flush with each other.

The first principal surface 11B includes a terminal electrode 100B for heat dissipation. The first principal surface 12B includes a plurality of terminal electrodes 103B for external connection. The terminal electrode 100B for heat dissipation corresponds to the "terminal electrode for heat dissipation", and the plurality of terminal electrode 103B for external connection correspond to the "terminal electrode for external connection". The plurality of terminal electrodes 103B for external connection are provided on the first principal surface 12B in a predetermined arrangement pattern.

The terminal electrode 100B for heat dissipation preferably has a rectangular or substantially rectangular shape in a plan view from a side of the first principal surface 11B. A width of the terminal electrode 100B for heat dissipation is preferably the same or substantially the same as a width of the interposer substrate 10B, and, in a plan view, extends to the entire or substantially the entire region in which the terminal electrode 103B for external connection of the first principal surface 12B is not provided.

A conductor 150B for heat conduction of which a width is preferably the same or substantially the same as the width of the terminal electrode 100B for heat dissipation is provided inside the interposer substrate 10B. The conductor 150B for heat conduction is a via conductor that extends in a direction perpendicular or substantially perpendicular to the first principal surface 11B and the second principal surface 13B. The conductor 150B for heat conduction connects the terminal electrode 100B for heat dissipation and the terminal electrode 105B for heat dissipation.

As shown in FIG. 13, the land electrode 104B for heat dissipation is provided on a first principal surface 601 of the printed wiring board 60. The terminal electrode 105B for heat dissipation provided on the second principal surface 13B of the interposer substrate 10B is connected to the land electrode 104B for heat dissipation through solder 140. The terminal electrode 100B for heat dissipation provided on the first principal surface 11B of the interposer substrate 10B is connected to an element 30 for heat dissipation through a conductive element 310.

A plurality of external terminal electrodes 210B are provided on a flexible element 20B. The plurality of terminal electrodes 103B for external connection of the interposer substrate 10B are connected to the plurality of external terminal electrodes 210B through solder 141, respectively.

Even with such a configuration, heat generated in the printed wiring board 60 is able to be efficiently conducted in order of the terminal electrode 105B for heat dissipation, the conductor 150B for heat conduction, and the terminal electrode 100B for heat dissipation.

In addition, a cross-sectional area of the conductor 150B for heat conduction is preferably larger than the cross-sectional area of the conductor 150 for heat conduction according to the first preferred embodiment, in a plan view from the first principal surface 11B of the interposer substrate 10B, so that heat is able to be more efficiently dissipated.

Fourth Preferred Embodiment

Figure 14:
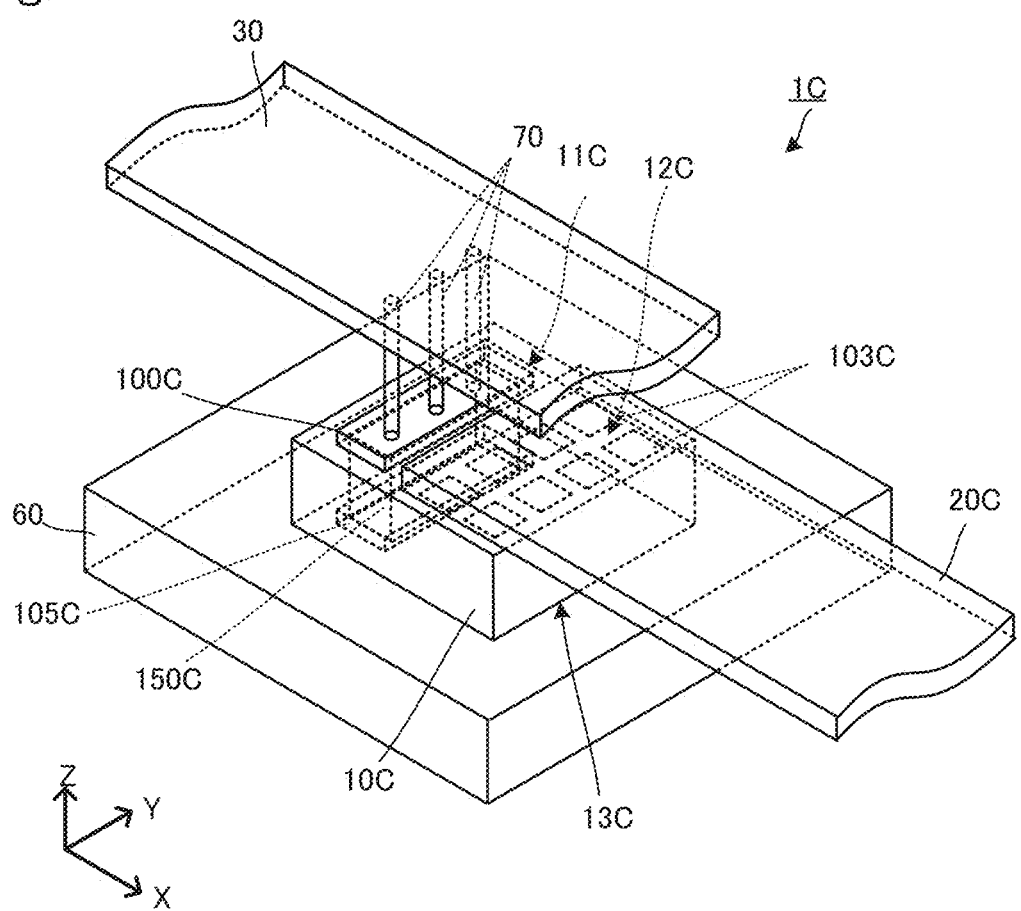
FIG. 14 is a perspective view showing a configuration of a portion of an electronic device 1C according to a fourth preferred embodiment of the present invention.
Figure 15:
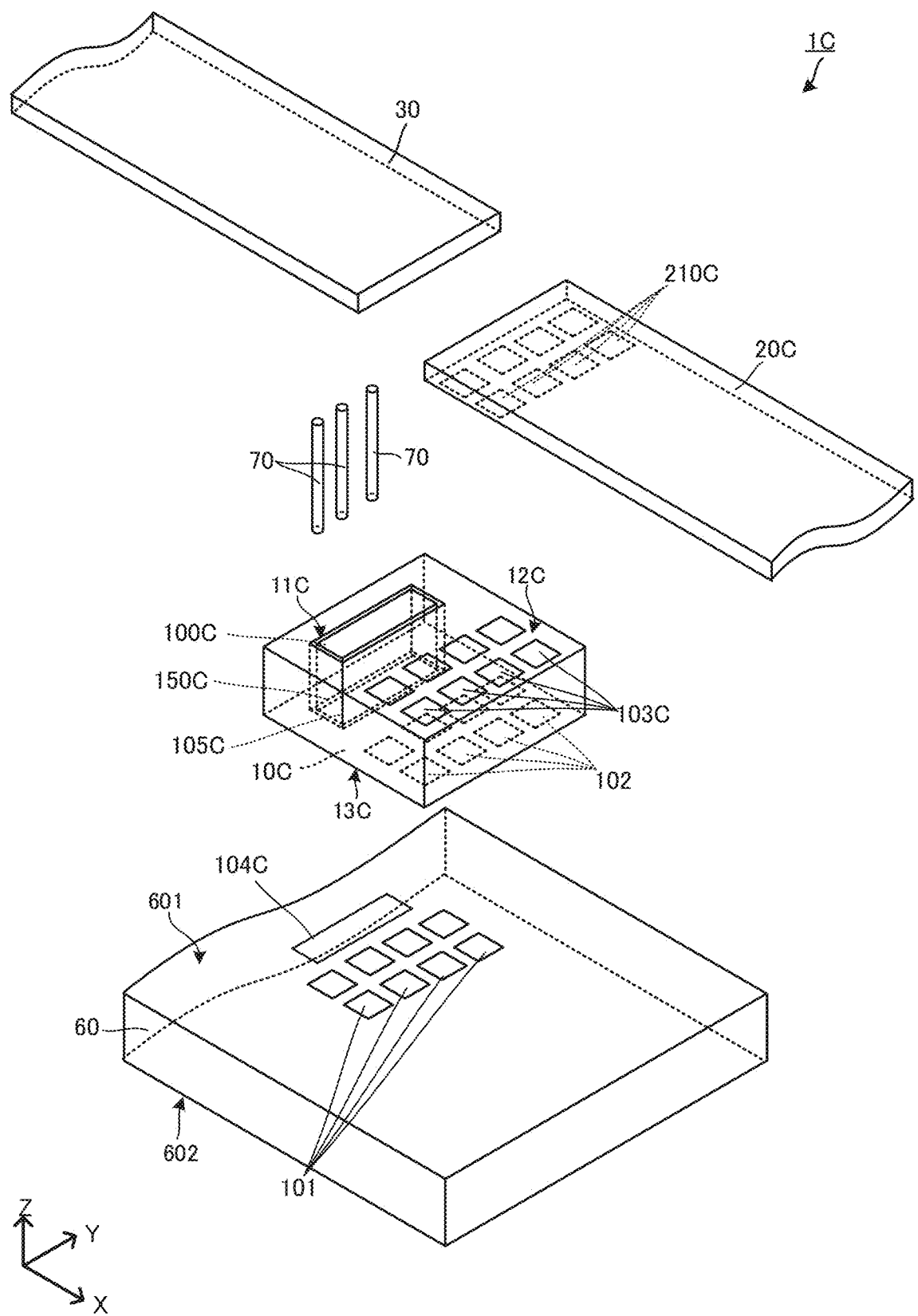
FIG. 15 is an exploded perspective view showing a configuration of the portion of the electronic device 1C according to the fourth preferred embodiment of the present invention.
Figure 16:
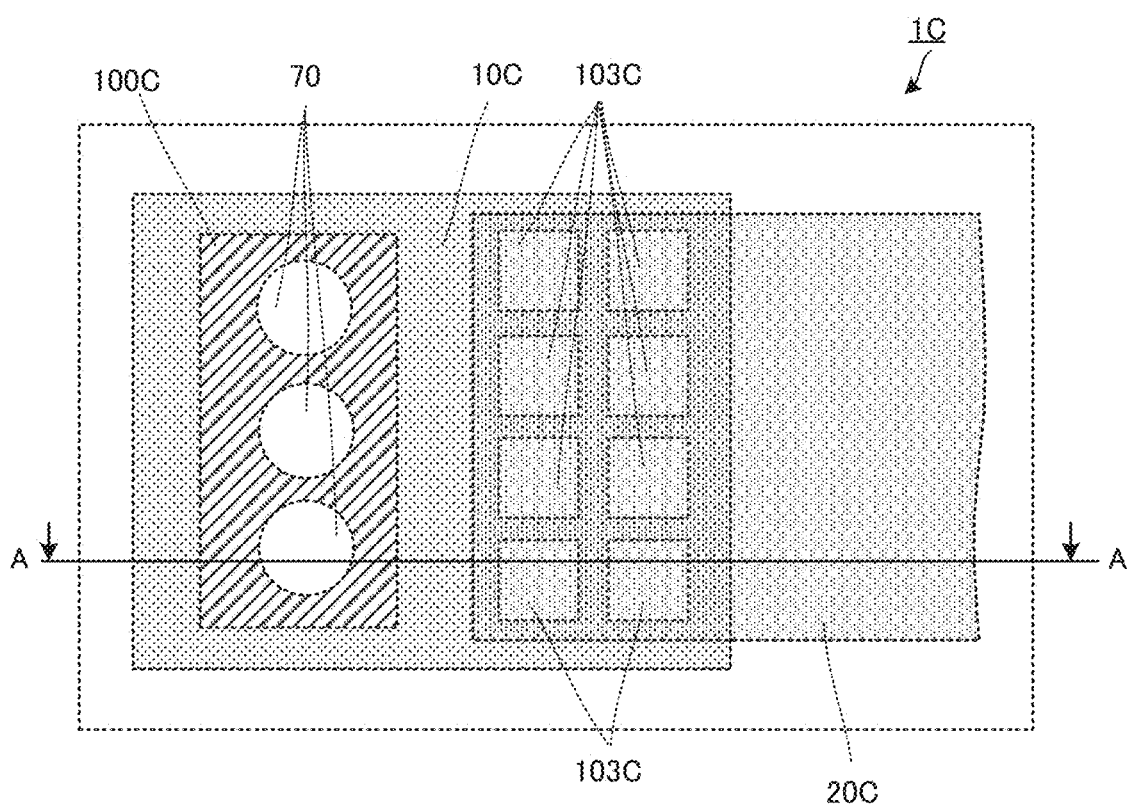
FIG. 16 is a view showing a configuration of a portion of the electronic device 1C viewed from a side of a first principal surface of the electronic device 1C according to the fourth preferred embodiment of the present invention.
Figure 17:
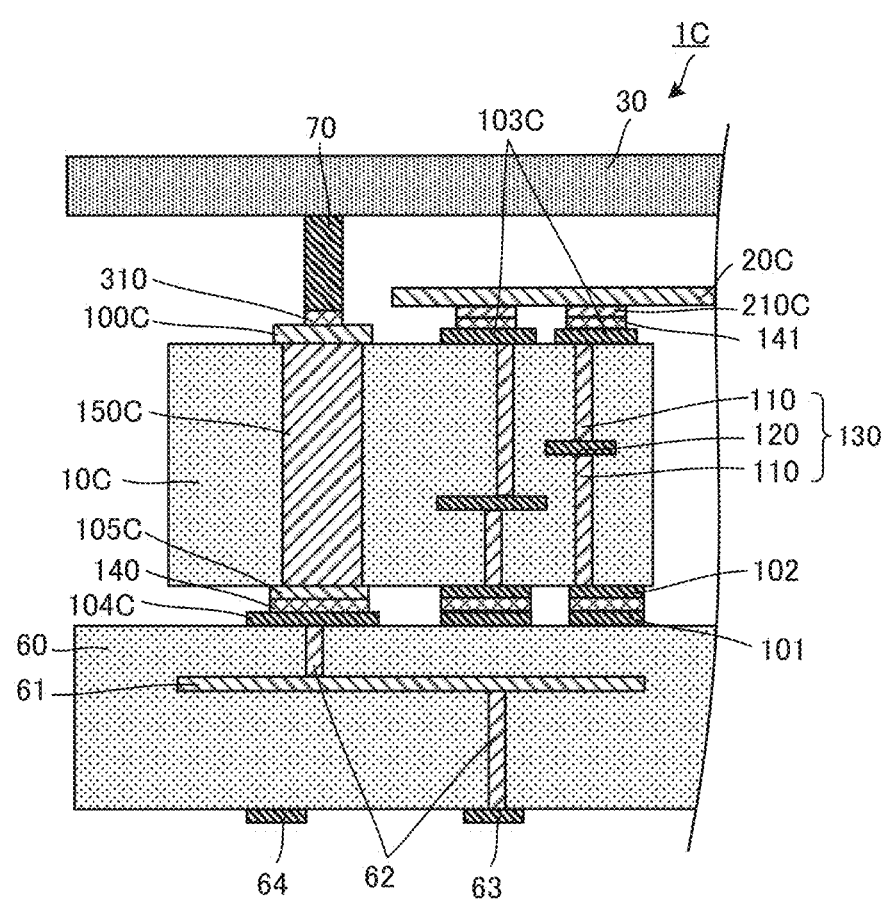
FIG. 17 is a side cross-sectional view showing a configuration of a portion of the electronic device 1C according to the fourth preferred embodiment of the present invention.

An electronic device according to a fourth preferred embodiment of the present invention will be described with reference to the drawings. FIG. 14 is a perspective view showing a configuration of a portion of an electronic device 1C according to the fourth preferred embodiment of the present invention. FIG. 15 is an exploded perspective view showing a configuration of the portion of the electronic device 1C according to the fourth preferred embodiment of the present invention. FIG. 16 is a view showing a configuration of a portion of the electronic device 1C viewed from a side of a first principal surface of the electronic device 1C according to the fourth preferred embodiment of the present invention. FIG. 17 is a cross-sectional view taken along a line A-A in FIG. 16, showing a configuration of a portion of the electronic device 1C according to the fourth preferred embodiment of the present invention.

As shown in FIG. 14, FIG. 15, FIG. 16, and FIG. 17, the electronic device 1C according to the fourth preferred embodiment and the electronic device 1 according to the first preferred embodiment are different in the shapes of an interposer substrate 10C, and a land electrode 104C for heat dissipation provided on a printed wiring board 60, and in that a pin 70 for heat conduction is included. Other configurations of the electronic device 1C are the same as or similar to the configurations of the electronic device 1, and a description of the same or similar configurations will be omitted. In FIG. 14, FIG. 15, FIG. 16, and FIG. 17, in order to make the drawings easy to see, the addition of some electronic components and some reference numerals is omitted.

As shown in FIG. 14, FIG. 15, and FIG. 16, the interposer substrate 10C includes first principal surfaces 11C and 12C and a second principal surface 13C. The first principal surface 11C and the first principal surface 12C are flush with each other.

The first principal surface 11C includes a terminal electrode 100C for heat dissipation. The first principal surface 12C includes a plurality of terminal electrodes 103C for external connection. The terminal electrode 100C for heat dissipation corresponds to the "terminal electrode for heat dissipation", and the plurality of terminal electrode 103C for external connection correspond to the "terminal electrode for external connection". The plurality of terminal electrodes 103C for external connection are provided on the first principal surface 12C in a predetermined arrangement pattern. The terminal electrode 100C for heat dissipation preferably has a rectangular or substantially rectangular shape in a plan view from a side of the first principal surface 11C.

A plurality of pins 70 for heat conduction are provided on a surface that is not in contact with the interposer substrate 10C of the terminal electrode 100C for heat dissipation through a conductive element 310.

The pin 70 for heat conduction is a metal element having a spring property and is preferably a pogo pin, for example.

A conductor 150C for heat conduction of which a width is preferably the same or substantially the same as the width of the terminal electrode 100C for heat dissipation is provided inside the interposer substrate 10C. The conductor 150C for heat conduction is a via conductor that extends in a direction perpendicular or substantially perpendicular to the first principal surface 11C and the second principal surface 13C. Each of a plurality of conductors 150C for heat conduction connects the terminal electrode 100C for heat dissipation and a terminal electrode 105C for heat dissipation.

The land electrode 104C for heat dissipation is provided on a first principal surface 601 of a printed wiring board 60. The terminal electrode 105C for heat dissipation provided on the second principal surface 13C of the interposer substrate 10C is connected to the land electrode 104C for heat dissipation through solder 140.

As shown in FIG. 17, the plurality of pins 70 for heat conduction are in contact with the element 30 for heat dissipation. As a result, the element 30 for heat dissipation is thermally connected to the plurality of pins 70 for heat conduction. Therefore, the printed wiring board 60 is thermally connected to the element 30 for heat dissipation through the interposer substrate 10C and the plurality of pins 70 for heat conduction.

A plurality of external terminal electrodes 210C are provided on a flexible element 20C. The plurality of terminal electrodes 103C for external connection of the interposer substrate 10C are connected to the plurality of external terminal electrodes 210C through solder 141, respectively.

Even with such a configuration, heat generated in the printed wiring board 60 is able to be efficiently conducted in order of the terminal electrode 105C for heat dissipation, the conductor 150C for heat conduction, the terminal electrode 100C for heat dissipation, and the pin 70 for heat conduction. In particular, even when an error occurs between the flexible element 20C and the element 30 for heat dissipation, the use of the pin with a spring property is able to absorb the error and bring the elements into contact with each other.

Fifth Preferred Embodiment

Figure 18:
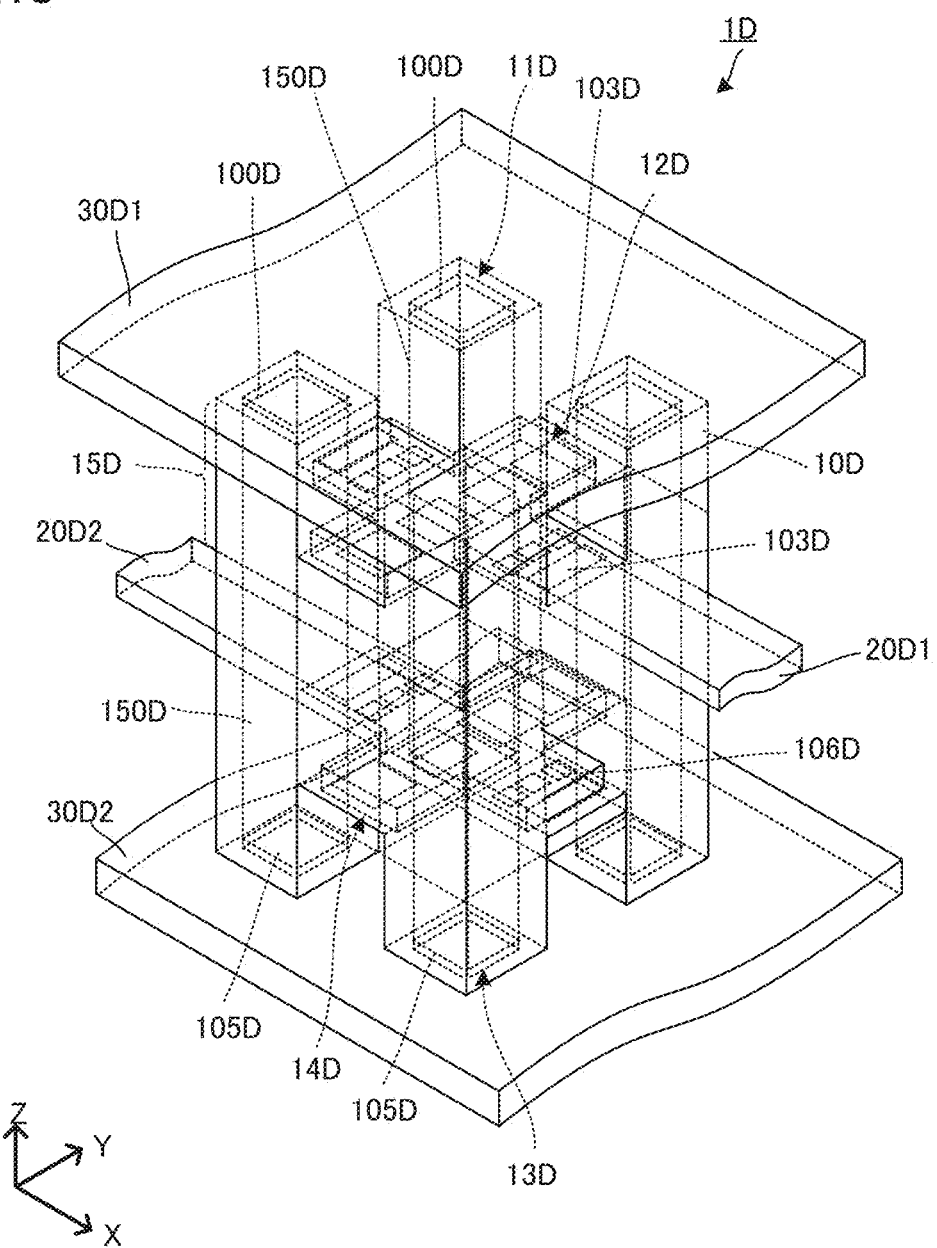
FIG. 18 is a perspective view showing a configuration of a portion of an electronic device 1D according to a fifth preferred embodiment of the present invention.
Figure 19:
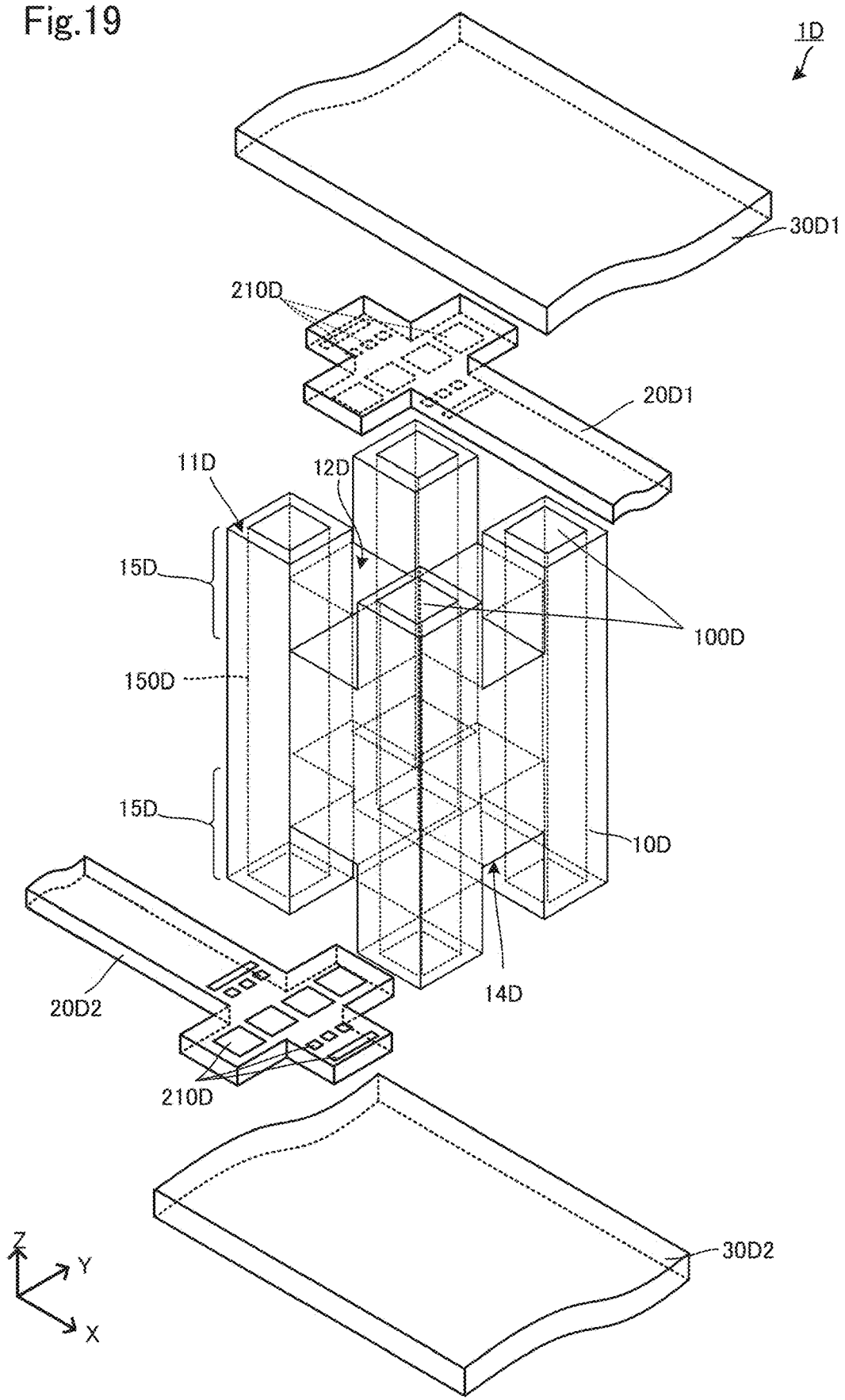
FIG. 19 is an exploded perspective view showing a configuration of the portion of the electronic device 1D according to the fifth preferred embodiment of the present invention.
Figure 20:
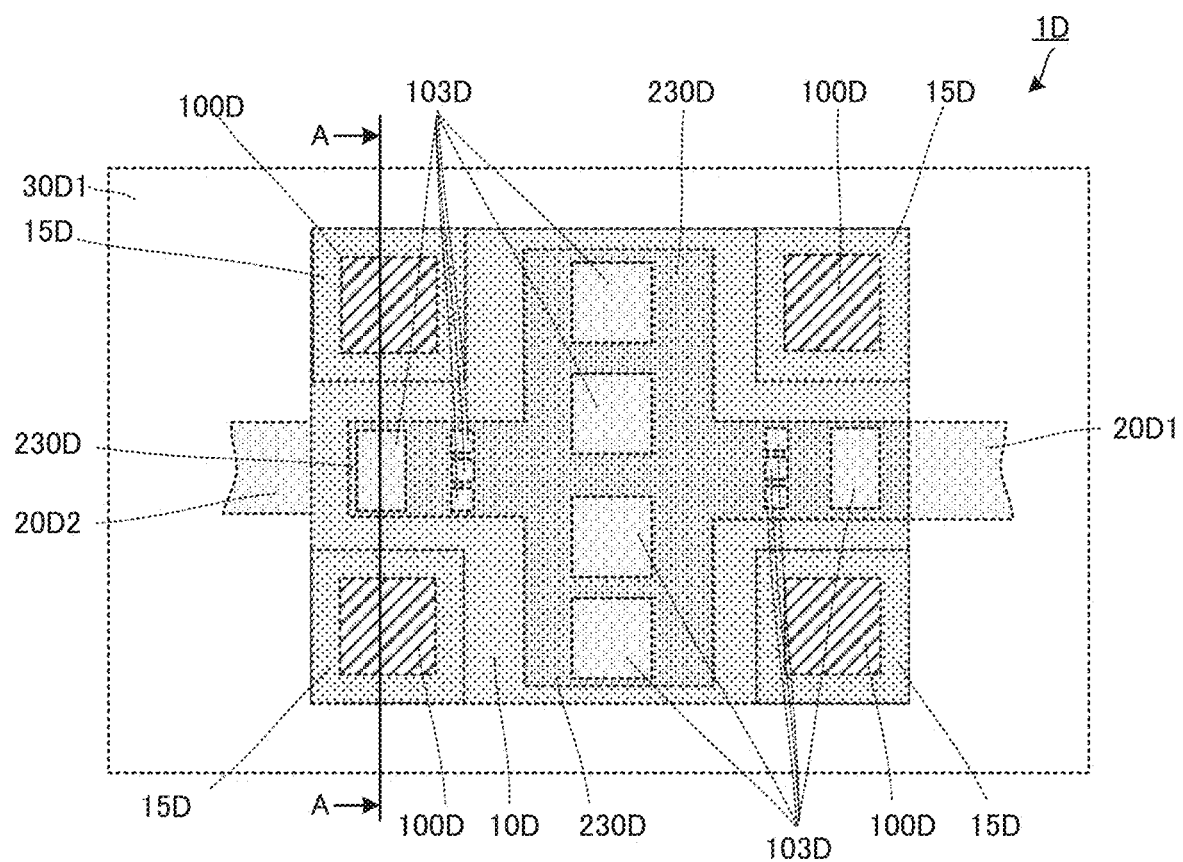
FIG. 20 is a view showing a configuration of a portion of the electronic device 1D viewed from a side of a first principal surface of the electronic device 1D according to the fifth preferred embodiment of the present invention.
Figure 21:
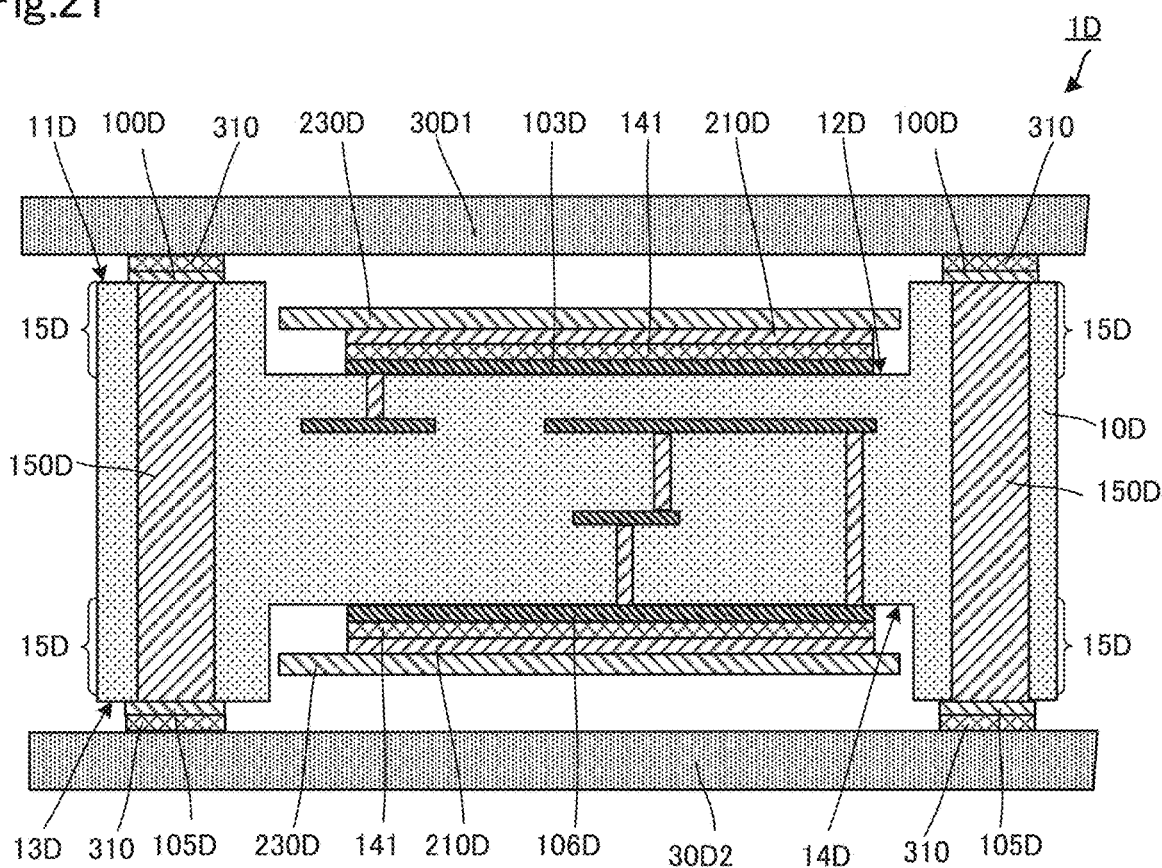
FIG. 21 is a side cross-sectional view showing a configuration of a portion of the electronic device 1D according to the fifth preferred embodiment of the present invention.

An electronic device according to a fifth preferred embodiment of the present invention will be described with reference to the drawings. FIG. 18 is a perspective view showing a configuration of a portion of an electronic device 1D according to the fifth preferred embodiment of the present invention. FIG. 19 is an exploded perspective view showing a configuration of the portion of the electronic device 1D according to the fifth preferred embodiment of the present invention. FIG. 20 is a view showing a configuration of a portion of the electronic device 1D viewed from a side of a first principal surface of the electronic device 1D according to the fifth preferred embodiment of the present invention. FIG. 21 is a cross-sectional view taken along a line A-A in FIG. 20, showing a configuration of a portion of the electronic device 1C according to the fifth preferred embodiment of the present invention.

As shown in FIG. 18, FIG. 19, FIG. 20, and FIG. 21, the electronic device 1D according to the fifth preferred embodiment and the electronic device 1 according to the first preferred embodiment are different in the shapes of an interposer substrate 10D, flexible elements 20D1 and 20D2, and elements 30D1 and 30D2 for heat dissipation. Other configurations of the electronic device 1D are the same as or similar to the configurations of the electronic device 1, and a description of the same or similar configurations will be omitted. In FIG. 18, FIG. 19, FIG. 20, and FIG. 21, in order to make the drawings easy to see, the addition of some electronic components and some reference numerals is omitted.

As shown in FIG. 18, FIG. 19, and FIG. 20, the interposer substrate 10D includes a plurality of convex-shaped portions 15D. More specifically, four convex-shaped portions 15D are preferably provided at four corners of each of a first principal surface 12D and a second principal surface 14D of the interposer substrate 10D.

The interposer substrate 10D includes first principal surfaces 11D and 12D and second principal surfaces 13D and 14D. In addition, a top surface of the convex-shaped portion 15D provided on a side of the first principal surface coincides with the first principal surface 11D, and a bottom surface of the convex-shaped portion 15D provided on a side of the second principal surface coincides with the second principal surface 13D.

The first principal surface 11D includes a terminal electrode 100D for heat dissipation. The second principal surface 13D includes a terminal electrode 105D for heat dissipation. The first principal surface 12D includes a plurality of terminal electrodes 103D for external connection. The second principal surface 14D includes a plurality of terminal electrodes 106D for external connection.

The terminal electrode 100D for heat dissipation corresponds to the "terminal electrode for heat dissipation". The terminal electrodes 103D and 106D for external connection correspond to the "terminal electrode for external connection". The plurality of terminal electrodes 103D and 106D for external connection are provided on the first principal surface 12D and the second principal surface 14D in a predetermined arrangement pattern.

A plurality of conductors 150D for heat conduction are provided inside the interposer substrate 10D. The plurality of conductors 150D for heat conduction are via conductors that extend in a direction perpendicular or substantially perpendicular to the first principal surface 11D and the second principal surface 13D. Each of the plurality of conductors 150D for heat conduction connects the terminal electrode 100D for heat dissipation provided on the first principal surface 11D and the terminal electrode 105D for heat dissipation provided on the second principal surface 13D.

The terminal electrode 100D for heat dissipation provided on each of the first principal surfaces 11D of the interposer substrate 10D is connected to the element 30D1 for heat dissipation through a conductive element 310. The terminal electrode 105D for heat dissipation provided on each of the second principal surface 13D of the interposer substrate 10D is connected to the element 30D2 for heat dissipation through the conductive element 310.

The flexible elements 20D1 and 20D2 include a plurality of projecting portions 230D at an end in an extending direction. One projecting portion 230D is provided in a direction in which the flexible elements 20D1 and 20D2 extend and two projecting portions 230D are provided in a direction perpendicular or substantially perpendicular to the extending direction of the flexible elements 20D1 and 20D2. With such a configuration including the plurality of projecting portions 230D, an attachment portion according to the fifth preferred embodiment is obtained. The attachment portion of the flexible elements 20D1 and 20D2 preferably has a cross shape, for example.

The flexible elements 20D1 and 20D2 are connected to the interposer substrate 10D by each attachment portion.

Specifically, as shown in FIG. 21, each of the projecting portions 230D provided on the flexible elements 20D1 and 20D2 is interposed between two convex-shaped portions 15D of the interposer substrate 10D. In such a state, the plurality of terminal electrodes 103D for external connection provided on the first principal surface 11D of the interposer substrate 10D and a plurality of external terminal electrode 210D provided on the flexible elements 20D1 and 20D2 are connected through solder 141.

Even with such a configuration, heat conducted to the flexible elements 20D1 and 20D2 is able to be efficiently conducted to the elements 30D1 and 30D2 for heat dissipation. It is to be noted that, as the diameter of the conductor 150D for heat conduction is larger than the diameter of the via conductor 110, heat is able to be more efficiently dissipated.

Further, with a configuration in which the flexible elements 20D1 and 20D2 include the plurality of projecting portions 230D, due to a shift at a time of attachment or a tensile stress, the flexible elements 20D1 and 20D2 are hardly separated from the interposer substrate 10D.

In addition, in the fifth preferred embodiment, the flexible elements 20D1 and 20D2 are connected to both of the first principal surface 11D and the second principal surface 13D of the interposer substrate 10D, so that a more flexible connection configuration is able to be achieved.

It is to be noted that, in the fifth preferred embodiment, the flexible element 20D1 and the flexible element 20D2, although being disposed in parallel or substantially in parallel to each other, may be disposed in a direction perpendicular or substantially perpendicular to each other.

Sixth Preferred Embodiment

Figure 22:
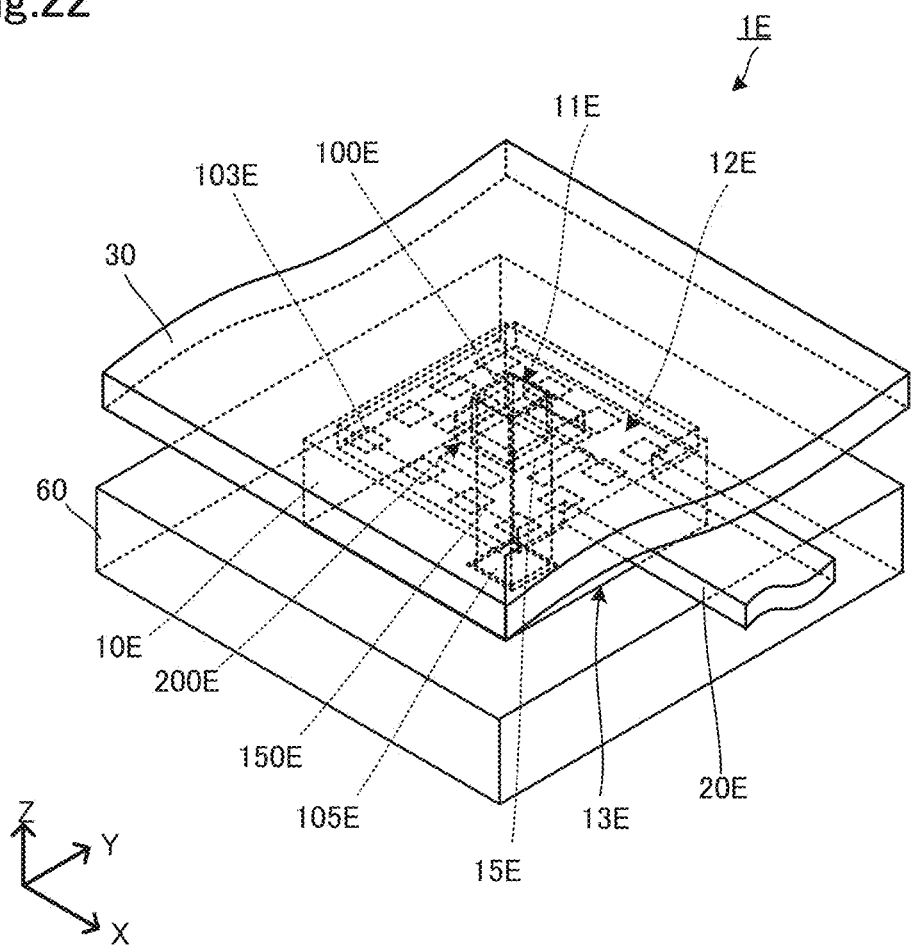
FIG. 22 is a perspective view showing a configuration of a portion of an electronic device 1E according to a sixth preferred embodiment of the present invention.
Figure 23:
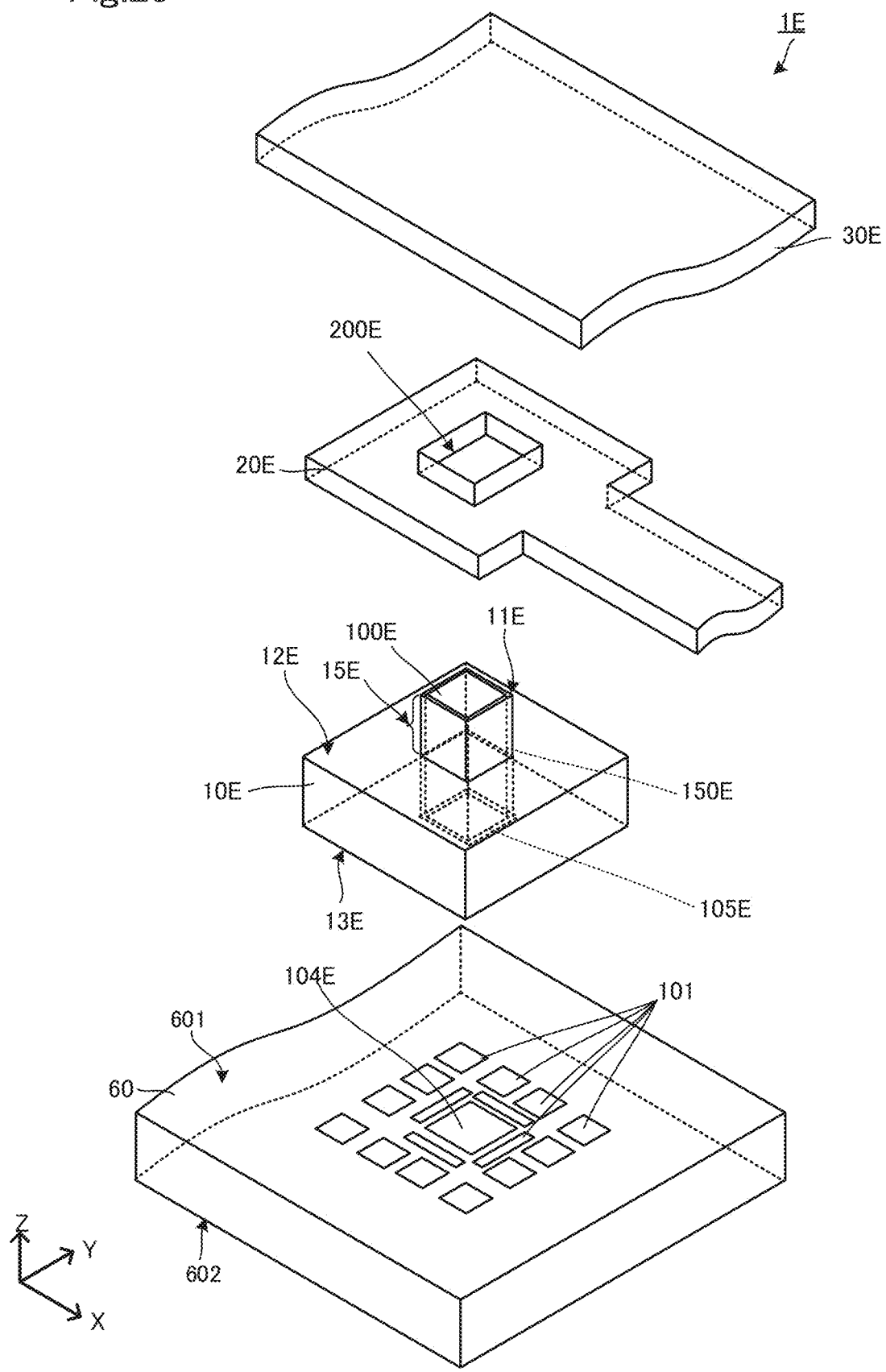
FIG. 23 is an exploded perspective view showing a configuration of the portion of the electronic device 1E according to the sixth preferred embodiment of the present invention.
Figure 24:
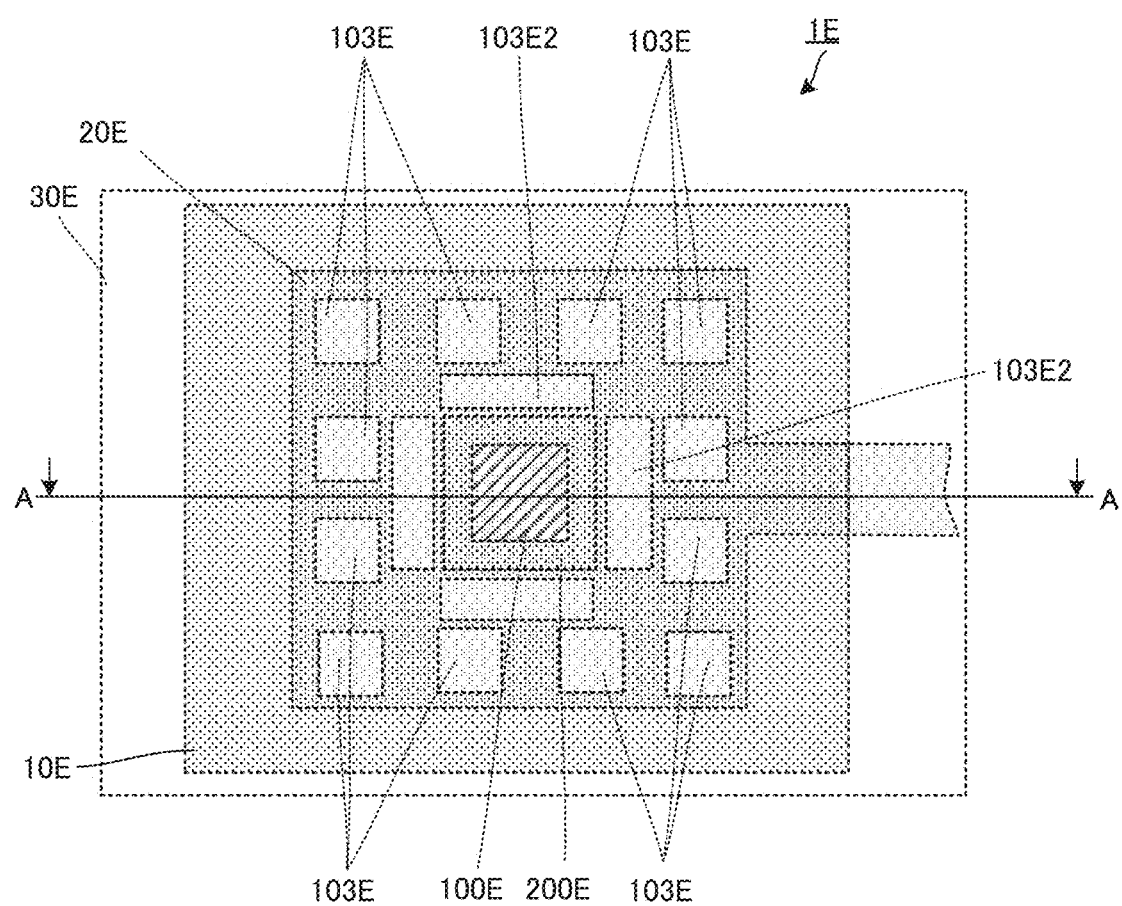
FIG. 24 is a view showing a configuration of a portion of the electronic device 1E viewed from the side of the first principal surface of the electronic device 1E according to the sixth preferred embodiment of the present invention.
Figure 25:
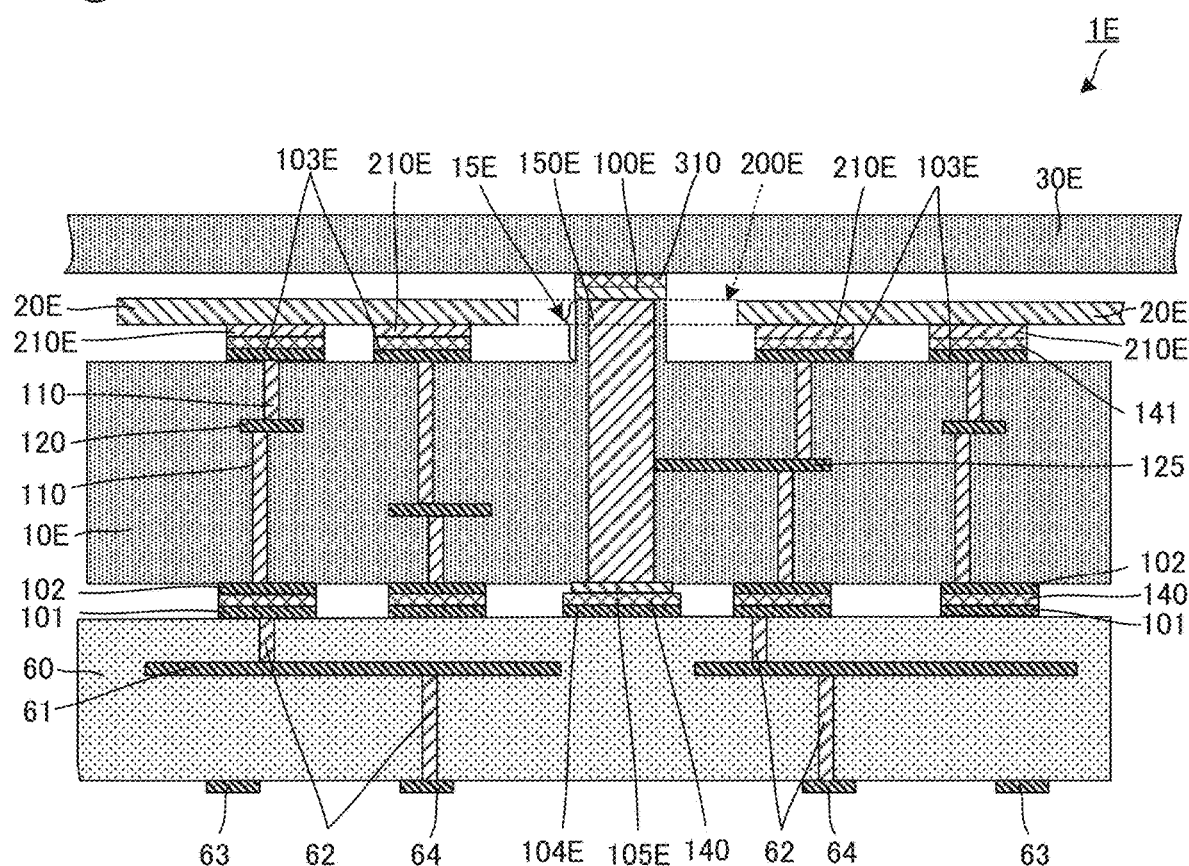
FIG. 25 is a side cross-sectional view showing a configuration of a portion of the electronic device 1E according to the sixth preferred embodiment of the present invention.

An electronic device according to a sixth preferred embodiment of the present invention will be described with reference to the drawings. FIG. 22 is a perspective view showing a configuration of a portion of an electronic device 1E according to the sixth preferred embodiment of the present invention. FIG. 23 is an exploded perspective view showing a configuration of the portion of the electronic device 1E according to the sixth preferred embodiment of the present invention. FIG. 24 is a view showing a configuration of a portion of the electronic device 1E viewed from a side of a first principal surface of the electronic device 1E according to the sixth preferred embodiment of the present invention. FIG. 25 is a cross-sectional view taken along a line A-A in FIG. 24, showing a configuration of a portion of the electronic device 1E according to the sixth preferred embodiment of the present invention.

As shown in FIG. 22, FIG. 23, FIG. 24, and FIG. 25, the electronic device 1E according to the sixth preferred embodiment and the electronic device 1 according to the first preferred embodiment are different in the shapes of an interposer substrate 10E, a flexible element 20E, and a land electrode 104E for heat dissipation provided on a printed wiring board 60. Other configurations of the electronic device 1E are the same as or similar to the configurations of the electronic device 1, and a description of the same or similar configurations will be omitted. In FIG. 22, FIG. 23, FIG. 24, and FIG. 25, in order to make the drawings easy to see, the addition of some electronic components and some reference numerals is omitted.

As shown in FIG. 22, FIG. 23, and FIG. 24, the interposer substrate 10E includes a convex-shaped portion 15E. More specifically, the interposer substrate 10E includes the convex-shaped portion 15E.

The interposer substrate 10E includes first principal surfaces 11E and 12E and a second principal surface 13E. In addition, a top surface of the convex-shaped portion 15E provided on a side of the first principal surface coincides with the first principal surface 11E.

A terminal electrode 100E for heat dissipation is provided on the first principal surface 11E. A plurality of terminal electrodes 103E and 103E2 for external connection are provided on the first principal surface 12E. The terminal electrode 103E2 for external connection is provided near the terminal electrode 100E for heat dissipation of the flexible element 20E.

The terminal electrode 100E for heat dissipation corresponds to the "terminal electrode for heat dissipation". The terminal electrode 103E for external connection corresponds to the "terminal electrode for external connection". The plurality of terminal electrodes 103E for external connection are provided on the first principal surface 12E in a predetermined arrangement pattern.

A conductor 150E for heat conduction is provided inside the interposer substrate 10E. The conductor 150E for heat conduction is a via conductor that extends in a direction perpendicular or substantially perpendicular to the first principal surface 11E and the second principal surface 13E. The conductor 150E for heat conduction connects the terminal electrode 100E for heat dissipation provided on the first principal surface 11E and the terminal electrode 105E for heat dissipation provided on the second principal surface 13E.

The land electrode 104E for heat dissipation is provided on a first principal surface 601 of a printed wiring board 60. The terminal electrode 105E for heat dissipation of the interposer substrate 10E is connected to the land electrode 104E for heat dissipation through solder 140. The terminal electrode 100E for heat dissipation of the interposer substrate 10E is connected to an element 30E for heat dissipation through a conductive element 310. In other words, the printed wiring board 60 is connected to the element 30E for heat dissipation through the interposer substrate 10E.

The flexible element 20E includes an opening 200E. The opening 200E is provided in an attachment portion of the flexible element 20E.

The flexible element 20E is connected to the interposer substrate 10E by the attachment portion.

The opening 200E has a size large enough to surround an outer periphery of the convex-shaped portion 15E when viewed from a side of the first principal surface 11E of the interposer substrate 10E. In other words, in a plan view from the side of the first principal surface 11E of the interposer substrate 10E, the opening 200E of the flexible element 20E has a size including the convex-shaped portion 15E of the interposer substrate 10E.

Specifically, as shown in FIG. 25, the opening 200E surrounds the outer periphery of the convex-shaped portion 15E.

Even with such a configuration, heat generated in the printed wiring board 60 is able to be efficiently conducted in order of the terminal electrode 105E for heat dissipation, the conductor 150E for heat conduction, and the terminal electrode 100E for heat dissipation.

It is to be noted that, as the diameter of the conductor 150E for heat conduction is larger than the diameter of the via conductor 110 for signal transmission, heat is able to be more efficiently dissipated.

Further, with a configuration in which the flexible element 20E includes the opening 200E, due to a shift at a time of attachment or a tensile stress, the flexible element 20E is hardly separated from the interposer substrate 10E. It is to be noted that the terminal electrode 103E2 for external connection has an area larger than the terminal electrode 103E for external connection, when viewed from the side of the first principal surface 11E. Accordingly, the flexible element 20E is further hardly separated from the interposer substrate 10E.

In addition, as shown in a flat conductor pattern 125, the flat conductor pattern 125 may include a structure in contact with the conductor 150E for heat conduction. Accordingly, heat transmitted from another circuit connected through the flexible element 20E to the interposer substrate 10E is conducted to the element 30E for heat dissipation through the conductor 150E for heat conduction. In the sixth preferred embodiment, the terminal electrode 100E for heat dissipation is connected to both of the terminal electrode 105E for heat dissipation and the terminal electrode 103E for external connection through the conductor for heat conduction 150E. However, the terminal electrode 100E for heat dissipation may be connected only to the terminal electrode 103E for external connection through the conductor 150E for heat conduction.

It is to be noted that each preferred embodiment other than the preferred embodiment including the pin for heat conduction of the present invention shows an example in which the element for heat dissipation and the terminal electrode for heat dissipation are connected using the solder or the conductive element that has thermal conductivity, such as conductive paste, for example. However, the element for heat dissipation and the terminal electrode for heat dissipation are able to obtain a similar heat dissipation effect even by simply contacting each other.

In addition, even when the element for heat dissipation and the terminal electrode for heat dissipation are not in contact with each other or are located in close proximity to such an extent that heat transmits, a heat dissipation effect is able to be obtained. In other words, as long as the element for heat dissipation and the terminal electrode for heat dissipation are thermally connected to each other, any suitable structure may be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device comprising:
   a printed wiring board on which a heat generating component is mounted;
   a heat dissipation element;
   a first element that has a flat film shape and includes a first terminal electrode; and
   an interposer substrate disposed between the first element and the heat dissipation element, and the printed wiring board; wherein
   the interposer substrate includes:
      a substrate body that includes a first principal surface and a second principal surface that faces the first principal surface;
      a second terminal electrode for heat dissipation that is provided on the first principal surface;
      a third terminal electrode for external connection that is provided on the first principal surface;
      a surface terminal electrode that is provided on the second principal surface;
      a signal transmission conductor that is provided in the substrate body and connects the third terminal electrode and the surface terminal electrode; and
      a heat conduction conductor that is provided in the substrate body and connects the third terminal electrode to the second terminal electrode or connects the surface terminal electrode to the second terminal electrode;
   the interposer substrate electrically connects the printed wiring board and the first element;
   the interposer substrate thermally connects the printed wiring board and the heat dissipation element;
   the third terminal electrode is bonded to the first terminal electrode;
   the second terminal electrode is thermally connected to the heat dissipation element; and
   the surface terminal electrode is connected to the printed wiring board through a conductive bonding material.

2. The electronic device according to claim 1, wherein
   at least one convex-shaped portion is provided on the first principal surface; and
   the second terminal electrode is provided on a top surface of the convex-shaped portion.

3. The electronic device according to claim 2, wherein
   the first element includes an attachment portion that includes the first terminal electrode;
   the attachment portion includes an opening;
   the opening, when viewed from a direction perpendicular or substantially perpendicular to the first principal surface and the second principal surface, has a same or substantially a same shape as the convex-shaped portion or has a shape that surrounds at least a portion of the convex-shaped portion; and
   the convex-shaped portion is disposed inside the opening.

4. The electronic device according to claim 3, wherein the attachment portion has a cross shape.

5. The electronic device according to claim 2, wherein
   the first element includes an attachment portion that includes the first terminal electrode;
   the attachment portion includes at least one projecting portion projecting in an extending direction of the first element and in a direction perpendicular or substantially perpendicular to a thickness direction of the first element;
   the interposer substrate includes at least two convex-shaped portions; and
   the projecting portion is disposed between the at least two convex-shaped portions.

6. The electronic device according to claim 5, wherein the attachment portion has a cross shape.

7. The electronic device according to claim 2, wherein the at least one convex-shaped portion includes four convex-shaped portions provided at four corners of the first principal surface of the interposer substrate.

8. The electronic device according to claim 1, wherein the heat conduction conductor connects the second terminal electrode and the surface terminal electrode and includes a via conductor that extends in a direction perpendicular or substantially perpendicular to the first principal surface and the second principal surface of the substrate body.

9. The electronic device according to claim 1, wherein, when viewed from a direction perpendicular or substantially perpendicular to the first principal surface and the second principal surface, the heat conduction conductor has a cross-sectional area larger than the signal transmission conductor.

10. The electronic device according to claim 1, wherein the printed wiring board is made of glass epoxy.

11. The electronic device according to claim 1, wherein the interposer substrate includes glass ceramics as a main component.

12. The electronic device according to claim 1, wherein the first element is made of polyimide or liquid crystal polymer.

13. The electronic device according to claim 1, wherein the heat dissipation element is one of a metal plate, a heat pipe, a heat sink, a heat spreader, a graphite sheet, or a metal housing.

14. The electronic device according to claim 1, wherein a plurality of the heat conduction conductors are provided inside the interposer substrate.

15. The electronic device according to claim 1, wherein the second terminal electrode has a rectangular or substantially rectangular shape in a plan view from a side of the first principal surface.

16. The electronic device according to claim 15, wherein a width of the second terminal electrode is the same or substantially the same as a width of the interposer substrate.

17. The electronic device according to claim 15, wherein a width of the heat conduction conductor is the same or substantially the same as a width of the terminal electrode.

18. The electronic device according to claim 1, further comprising at least one pin for heat conduction provided on a surface of the second terminal electrode not in contact with the interposer substrate.

19. The electronic device according to claim 1, wherein the first element is a flexible element.

* * * * *